United States Patent
Holland et al.

(10) Patent No.: US 10,978,557 B2
(45) Date of Patent: Apr. 13, 2021

(54) METHOD OF FABRICATING SEMICONDUCTOR DEVICE WITH NANOWIRES

(71) Applicant: TAIWAN SEMICONDUCTOR MANUFACTURING CO., LTD., Hsinchu (TW)

(72) Inventors: Martin Christopher Holland, Bertem (BE); Mark Van Dal, Linden (BE); Georgios Vellianitis, Heverlee (BE); Blandine Duriez, Brussels (BE); Gerben Doornbos, Leuven (BE)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/449,611

(22) Filed: Jun. 24, 2019

(65) Prior Publication Data
US 2019/0312107 A1    Oct. 10, 2019

Related U.S. Application Data

(62) Division of application No. 15/588,804, filed on May 8, 2017, now Pat. No. 10,332,965.

(51) Int. Cl.
*H01L 29/08* (2006.01)
*H01L 29/78* (2006.01)
(Continued)

(52) U.S. Cl.
CPC .......... *H01L 29/0847* (2013.01); *B82Y 10/00* (2013.01); *H01L 29/045* (2013.01);
(Continued)

(58) Field of Classification Search
CPC ............... H01L 29/0847; H01L 29/045; H01L 29/0673; H01L 29/165; H01L 29/401;
(Continued)

(56) References Cited

U.S. PATENT DOCUMENTS 8,772,109 B2    7/2014  Colinge
8,785,285 B2    7/2014  Tsai et al.
(Continued)

OTHER PUBLICATIONS

M.J.H van Dal et al., "Material aspects and challenges for SOI FinFET integration", ECS Transactions, vol. 13 (1), 2008, pp. 223-234.
(Continued)

*Primary Examiner* — Shahed Ahmed
(74) *Attorney, Agent, or Firm* — Birch, Stewart, Kolasch & Birch, LLP

(57) ABSTRACT

A method includes forming a plurality of first semiconductor layers and second semiconductor layers in an alternate manner over a substrate; etching the first semiconductor layers and second semiconductor layers to form a fin structure, in which the fin structure comprises a plurality of first nanowires and second nanowires alternately arranged, the first nanowires have respective remaining portions of the first semiconductor layers, and the second nanowires have respective remaining portions of second semiconductor layers; forming a dummy gate over the fin structure; forming a plurality of gate spacers on opposite sidewalls of the dummy gate, respectively; replacing the dummy gate with a metal gate; removing first portions of the second nanowires exposed by the metal gate and metal gate and the gate spacers suspended; and forming an epitaxy layer wrapping around the first portions of the first nanowires, in which opposite sidewalls of the epitaxy layer have zig-zag contour.

20 Claims, 53 Drawing Sheets

(51) Int. Cl.

| | |
|---|---|
| *H01L 29/423* | (2006.01) |
| *H01L 29/06* | (2006.01) |
| *H01L 29/417* | (2006.01) |
| *H01L 29/66* | (2006.01) |
| *H01L 29/165* | (2006.01) |
| *H01L 29/04* | (2006.01) |
| *H01L 29/775* | (2006.01) |
| *B82Y 10/00* | (2011.01) |
| *H01L 29/40* | (2006.01) |
| *H01L 29/786* | (2006.01) |

(52) U.S. Cl.
CPC ........ *H01L 29/0673* (2013.01); *H01L 29/165* (2013.01); *H01L 29/401* (2013.01); *H01L 29/41791* (2013.01); *H01L 29/42364* (2013.01); *H01L 29/42392* (2013.01); *H01L 29/6653* (2013.01); *H01L 29/6681* (2013.01); *H01L 29/66439* (2013.01); *H01L 29/66545* (2013.01); *H01L 29/775* (2013.01); *H01L 29/7853* (2013.01); *H01L 29/78696* (2013.01)

(58) Field of Classification Search
CPC ......... H01L 29/41791; H01L 29/42364; H01L 29/42392; H01L 29/66439; H01L 29/6653; H01L 29/66545; H01L 29/6681; H01L 29/775; H01L 29/7853; H01L 29/78696; H01L 29/66795–66818; H01L 2029/7857–7858; H01L 29/0669–068; B82Y 10/00

See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 10,157,992 | B2* | 12/2018 | Badaroglu .......... H01L 29/4966 |
| 2005/0127534 | A1 | 6/2005 | Stecher et al. |
| 2015/0108573 | A1* | 4/2015 | Liu ................ H01L 21/823487 |
| | | | 257/347 |
| 2015/0144880 | A1 | 5/2015 | Rachmady et al. |
| 2016/0181352 | A1* | 6/2016 | Cheng .................... H01L 28/60 |
| | | | 257/532 |
| 2017/0005195 | A1* | 1/2017 | Ching ................. H01L 29/0673 |
| 2017/0162671 | A1 | 6/2017 | Basker et al. |
| 2017/0186846 | A1* | 6/2017 | Badaroglu .......... H01L 29/0878 |
| 2017/0200832 | A1 | 7/2017 | Hashemi et al. |
| 2017/0229458 | A1 | 8/2017 | Divakaruni et al. |
| 2017/0243791 | A1 | 8/2017 | Jacob |
| 2017/0317169 | A1 | 11/2017 | Bentley et al. |
| 2017/0358500 | A1* | 12/2017 | Lin ................... H01L 29/42392 |
| 2018/0182893 | A1 | 6/2018 | Coquand et al. |

OTHER PUBLICATIONS

Tomonori Nishimura et al.,"Reexamination of Fermi level pinning for controlling Schottky barrier height at metal/Ge interface", Applied Physics Express vol. 9, Jul. 15, 2016, pp. 081201-1-081201-4.

* cited by examiner

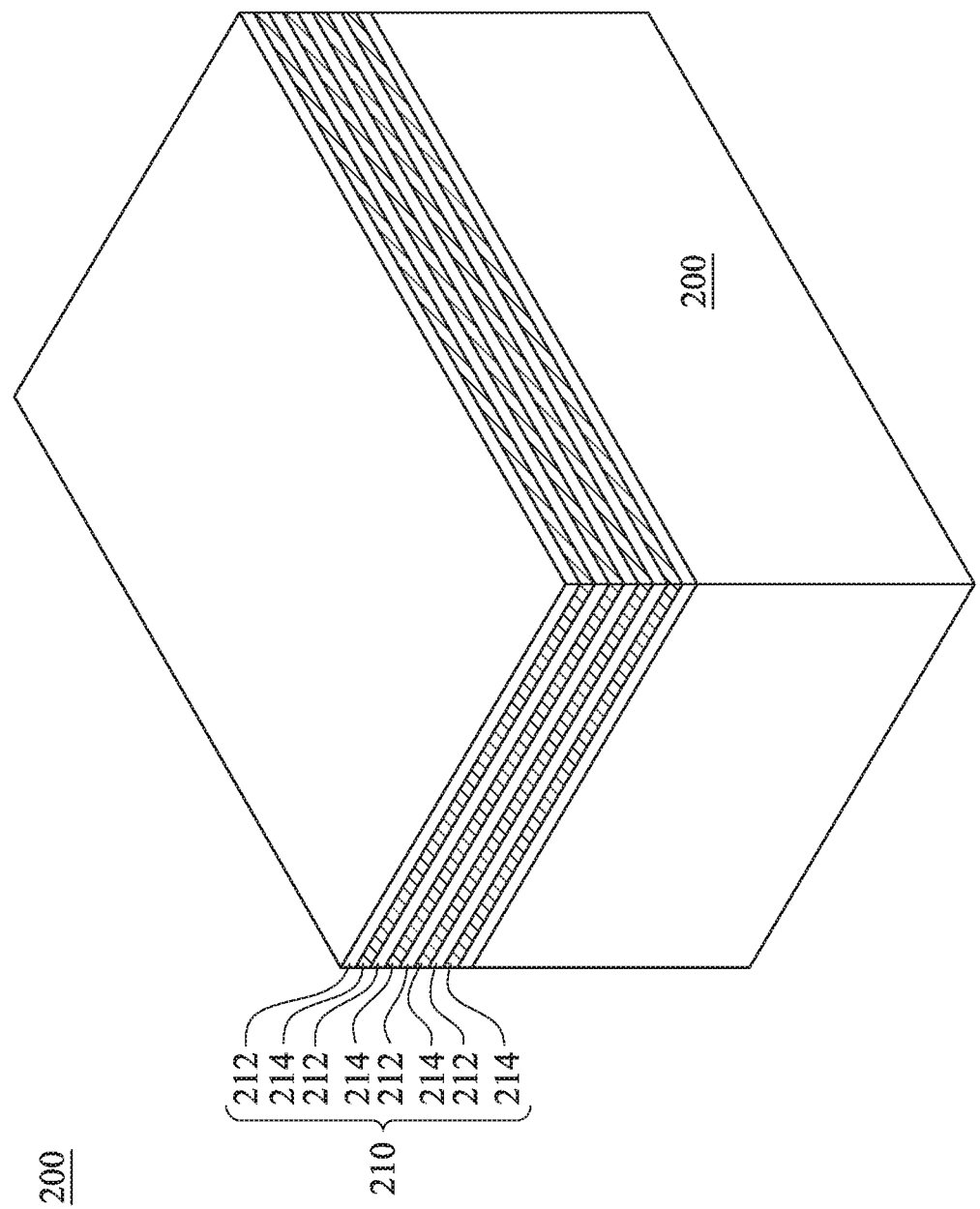

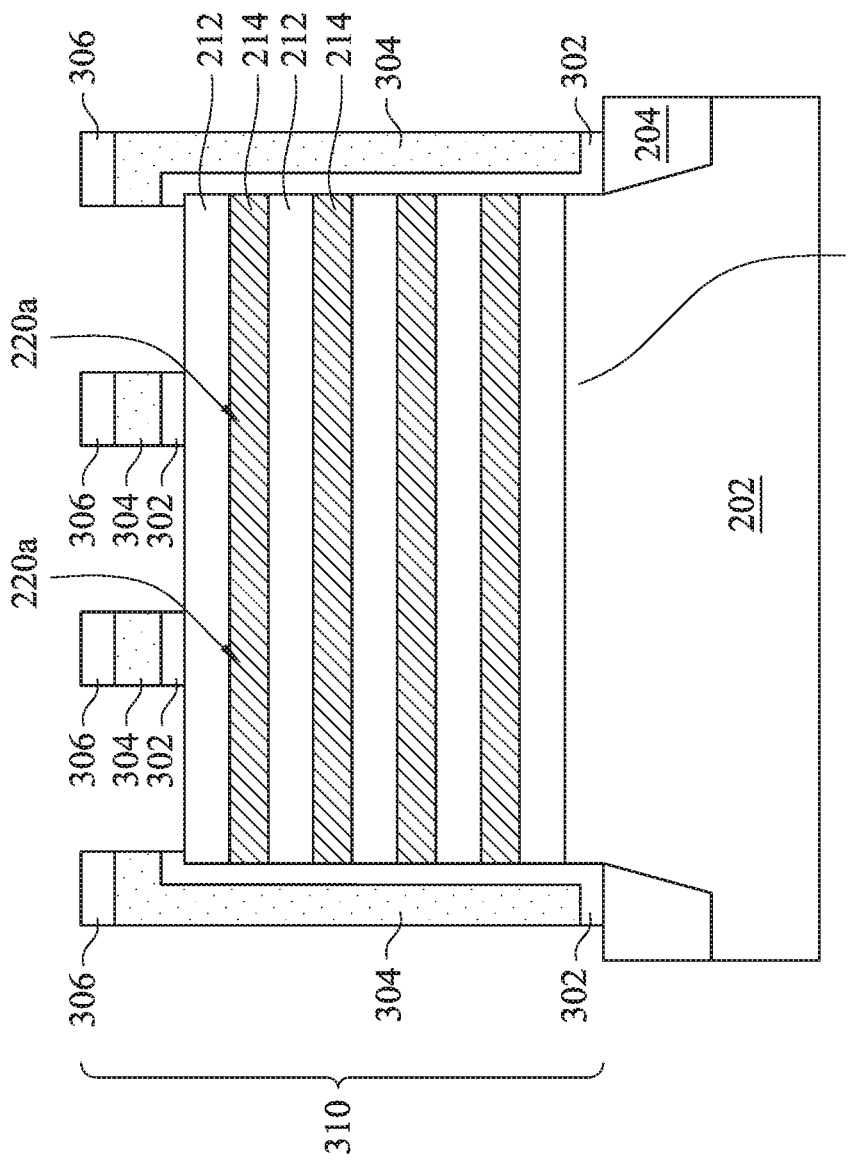

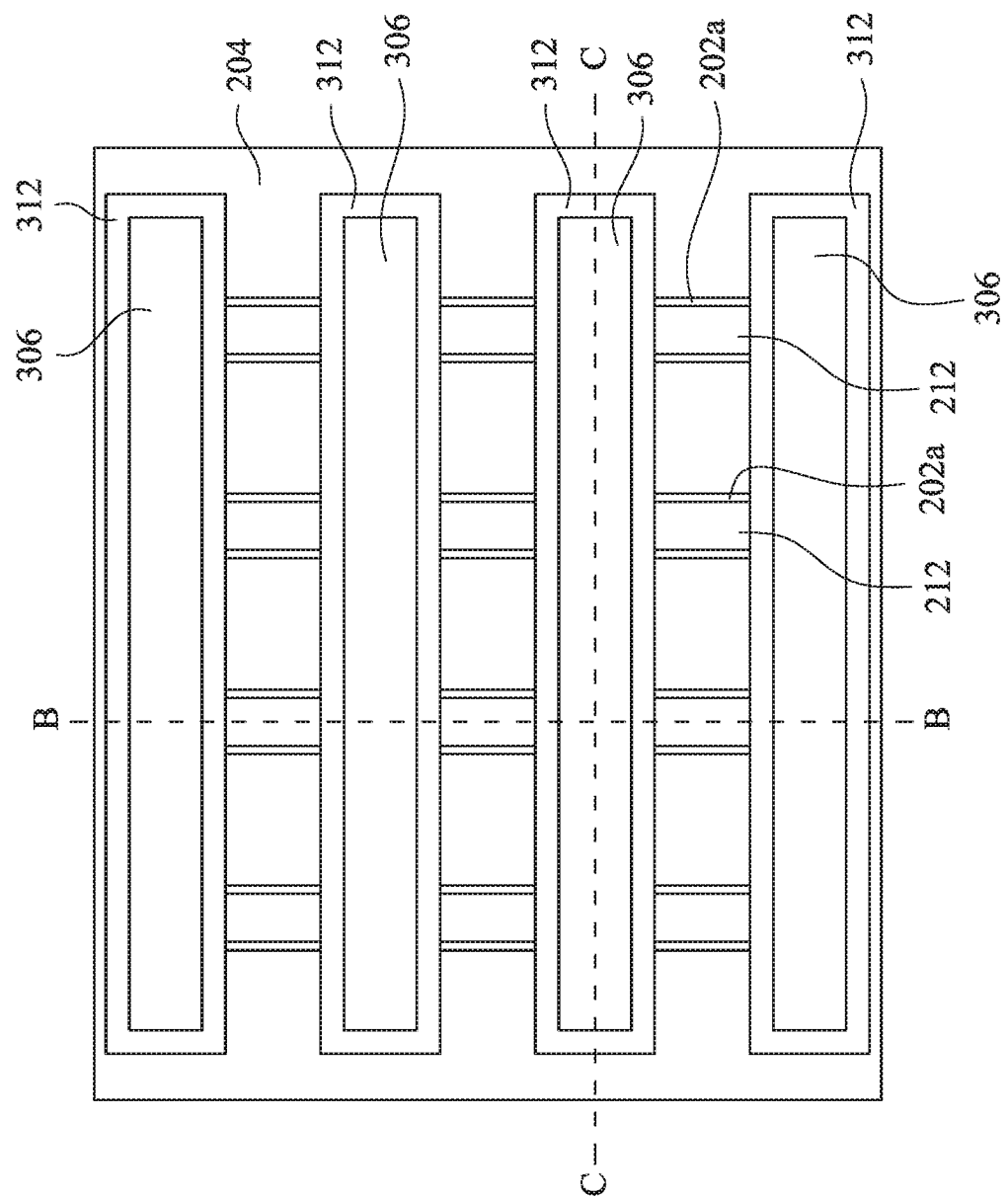

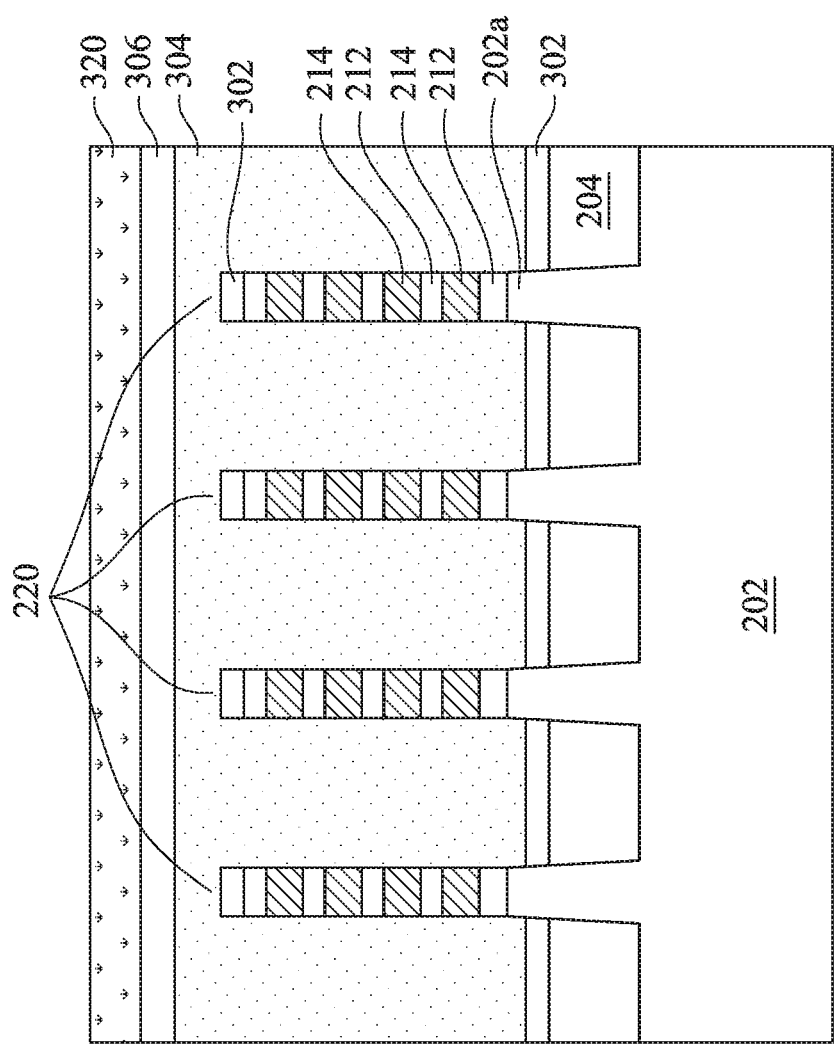

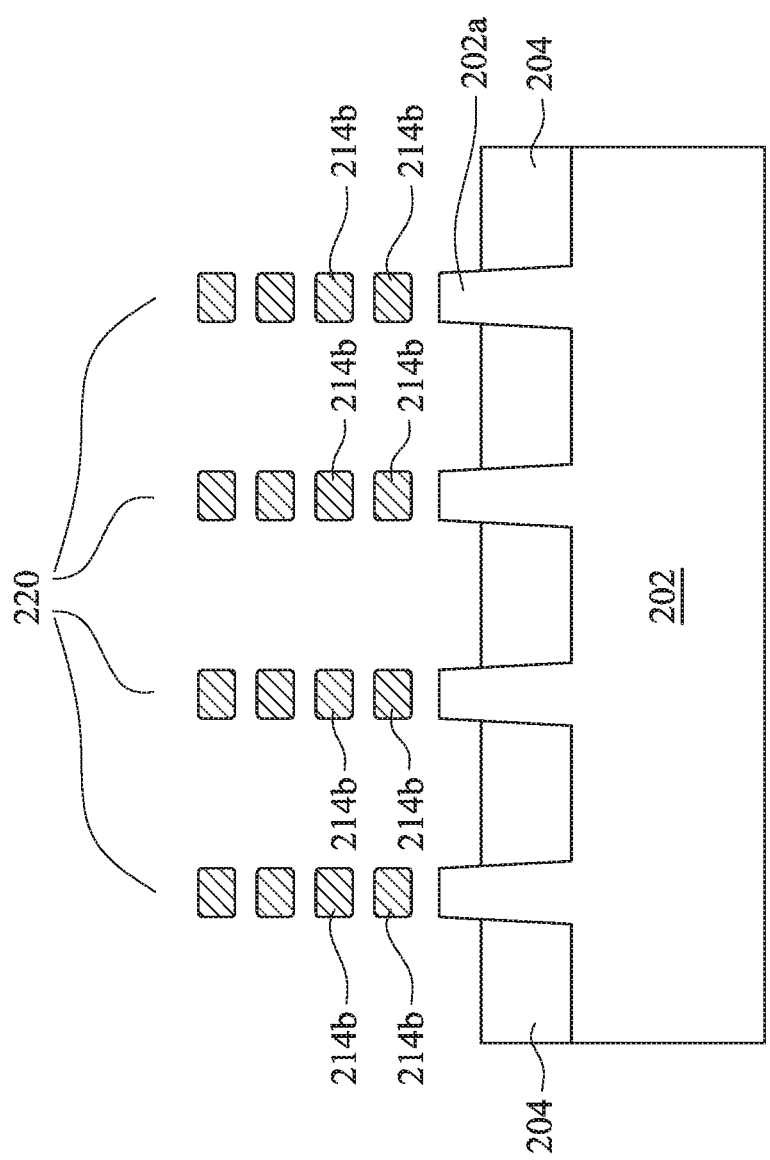

METHOD OF FABRICATING SEMICONDUCTOR DEVICE WITH NANOWIRES

RELATED APPLICATIONS

The present application is a Divisional application of U.S. application Ser. No. 15/588,804, filed on May 8, 2017, now U.S. Pat. No. 10,332,965, issued on Jun. 25, 2019, which is herein incorporated by reference in its entirety.

BACKGROUND

Semiconductor nanowires are becoming a major research focus in nanotechnology. Various methods of forming metal-oxide-semiconductor field-effect transistors (MOSFETs) comprising nanowires have been explored, including the use of dual material nanowire, where different material nanowires are used for N-channel field-effect transistor (NFET) and P-channel field-effect transistor (PFET) devices. For example, silicon (Si) nanowires may be used as the channel material for the NFET devices, while silicon germanium (SiGe) nanowires may be used as the channel material for the PFET devices. As another example, multiple-stacked ("multi-stack") nanowires have been used in forming NFET and PFET devices, having the advantage of increasing the current carrying capability of these devices. One of the leading multi-stack candidates is the trigate FET. A frigate FET device consists of a vertical standing Si body (fin) and the gate is wrapped around either side creating two channels on the sides and one on the top. High-aspect-ratio trigate FETs with aggressively scaled fin widths (30 nm and narrower) are of particular interest as they combine excellent short channel effect (SCE) immunity with high drivability per unit chip area.

The use of selective epitaxial Si growth (SEG) for raised source/drain epitaxy (in-situ doped) decreases access resistance. However, densely packed FET has very restricted space available for epitaxial growth. The epitaxial layer is prone to merge with the neighbouring epitaxial layer from another fin. Adverse effects like N-P shorts are likely to take place.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a illustrating a portion of a semiconductor substrate at a stage in a multi-stack nanowire FET device formation process in accordance with some embodiments of the instant disclosure;

FIGS. 5A-5C illustrate a top view, a cross-sectional view along section BB, and a cross-sectional view along section C-C of the device of FIG. 5A, respectively, in a multi-stack nanowire FET device formation process in accordance with some embodiments of the instant disclosure;

FIGS. 6A-6C illustrate a top view, a cross-sectional view along section BB, and a cross-sectional view along section C-C of the device of FIG. 6A, respectively, in a multi-stack nanowire FET device formation process in accordance with some embodiments of the instant disclosure;

FIGS. 7A-7C illustrate a top view, a cross-sectional view along section BB, and a cross-sectional view along section C-C of the device of FIG. 7A, respectively, in a multi-stack nanowire FET device formation process in accordance with some embodiments of the instant disclosure;

FIGS. 15A-15D illustrate a top view, a cross-sectional view along section BB, a cross-sectional view along section CC, and a cross-sectional view along section DD of the device of FIG. 15A, respectively, in a multi-stack nanowire FET device formation process in accordance with some embodiments of the instant disclosure;

DETAILED DESCRIPTION

Figure 1:
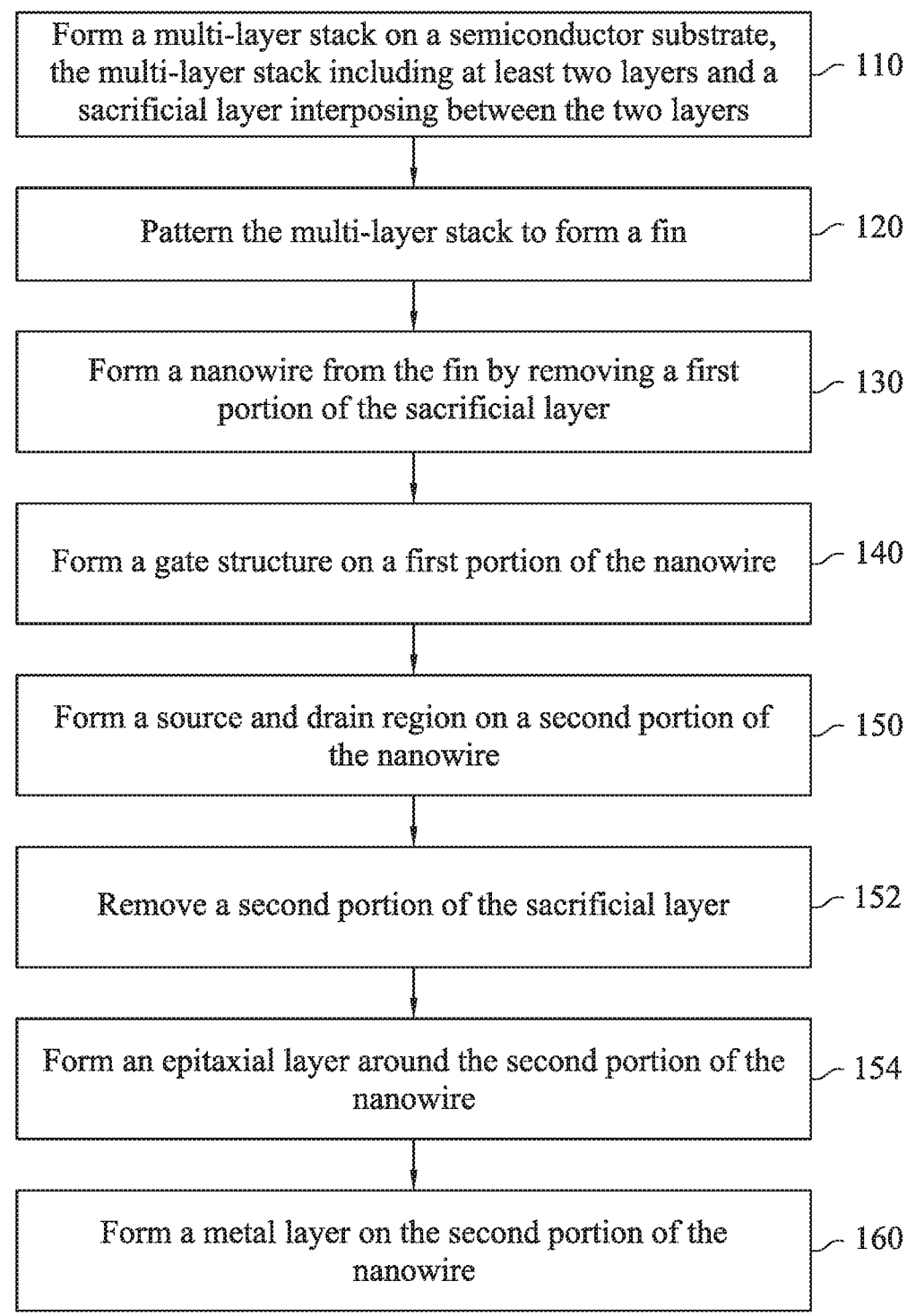
FIG. 1 is a flow chart illustrating a method of fabricating a multi-stack nanowires in FET device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

A multi-stack Si/SiGe structure may be used to generate multi-stack nanowire devices. Such multi-stack nanowire devices may include one or more PFET devices and one or more NFET devices, where the PFET devices include Ge nanowire and the NFET devices comprise Si nanowire. However, it is difficult to form an epitaxial layer on the source and drain region when the fin pitch is so narrow. Very often the diamond shape epitaxial layer on the source and drain region merges with the epitaxial layer on the neighbouring fin. Illustrative embodiments described herein utilize a dual nanowire release scheme for gate and source and drain region.

Referring to FIG. 1, illustrated a flow chart of a method 100 of fabricating a multi-stack nanowire FET device in accordance with some embodiments of the instant disclosure. The method begins with operation 110 in which a multi-layer stack is formed on a semiconductor substrate. The multi-layer stack includes at least two layers and a sacrificial layer interposing between the two layers. The method continues with operation 120 in which the multi-layer stack is patterned to form a fin. Subsequently, operation 130 is performed. A nanowire is formed from the fin by removing a first portion of the sacrificial layer. The method continues with operation 140 in which a gate structure is formed on a first portion of the nanowire. The method continues with operation 150 in which a source and drain region is formed on a second portion of the nanowire. The operation 150 includes operation 152 in which a second portion of the sacrificial layer is removed. After operation 152 the method continues with operation 154 in which an epitaxial layer is formed around the second portion of the nanowire. Next in operation 160 a metal layer is formed on the second portion of the nanowire. The discussion that follows illustrates embodiments of semiconductor devices that can be fabricated according to the method 100 of FIG. 1.

An illustrative embodiment for forming a multi-stack nanowire FET device will be described below with reference to FIGS. 2-17D. Each of the structures illustrates steps which may be used in the process of forming a multi-stack nanowire FET device.

Reference is made to FIG. 2 and operation 110 in FIG. 1. FIG. 2 is a schematic diagram of a structure 200. The structure 200 includes a semiconductor substrate 202 and a multi-layer stack 210. In some embodiments, the semiconductor substrate 202 includes Si. The multi-layer stack 210 includes sacrificial layers 212 and nanowire material layers 214. The sacrificial layers 212 and the nanowire material layers 214, are stacked alternatively. For example, a sacrificial layer 212 is interposed in between every two nanowire material layers 214. In some embodiments, the sacrificial layers 212 may include SiGe or. Si, and the nanowire material layers 214 may include Si or Ge, and the instant disclosure is not limited thereto. The nanowire material layers 214 may use the same material as the semiconductor substrate 202. The number of layers (sacrificial layer 212 and nanowire material layer 214) in the multi-layer stack 210 determines the number of nanowire material layers in a fin after patterning. FIG. 2 shows a multi-layer stack 210 having five sacrificial layers 212 and four nanowire material layers 214. In this case, four nanowire material layers are formed later, and the instant disclosure is not limited thereto. The thickness of the sacrificial layers 212 also determines the pitch between the nanowire material layers, and the thickness of the nanowire material layers 214 determines the dimension of the nanowire material layers.

Figure 3A:
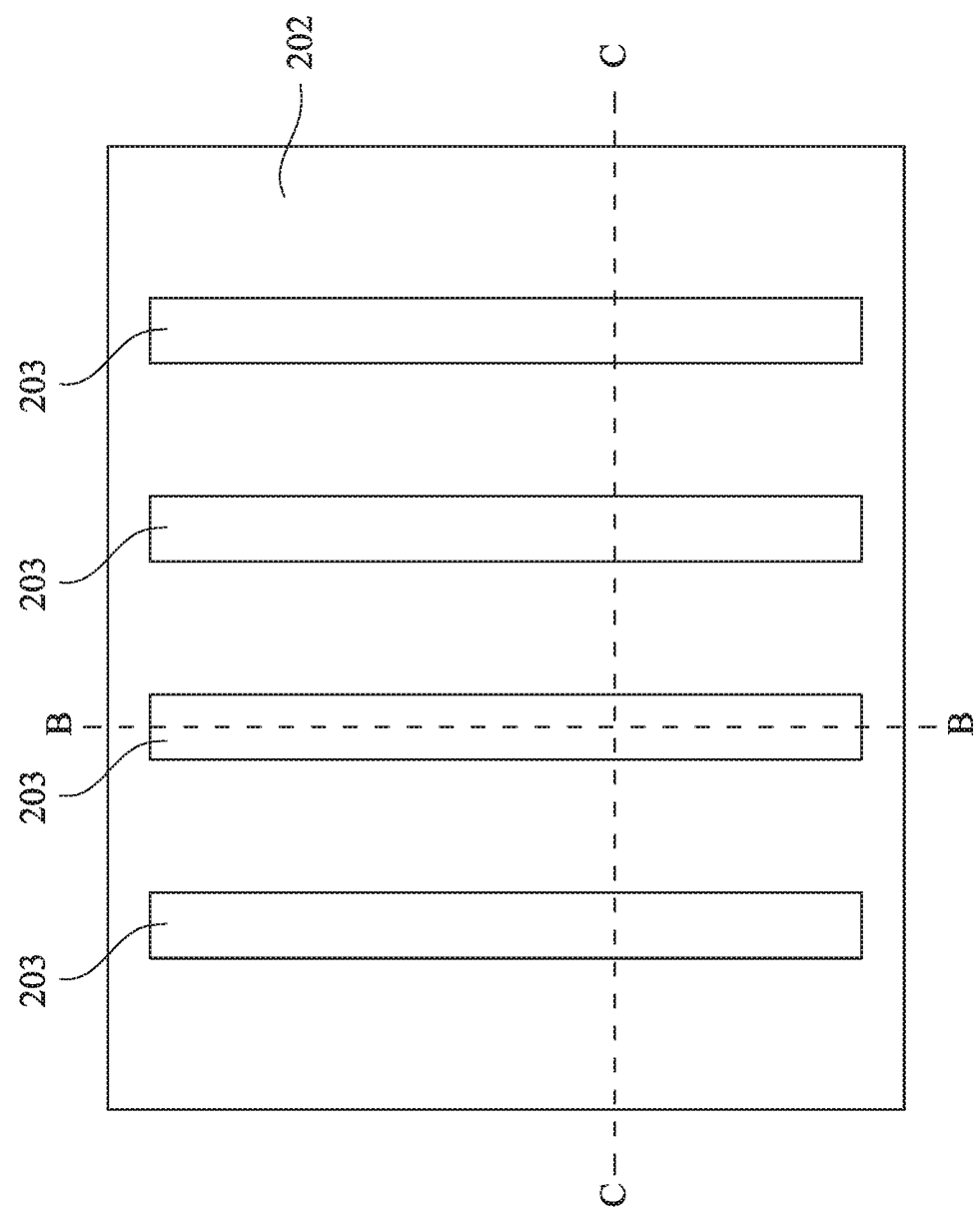
FIGS. 3A-3C illustrate a top view, a cross-sectional view along section BB, and a cross-sectional view along section C-C of the device of FIG. 3A, respectively, in a multi-stack nanowire FET device formation process in accordance with some embodiments of the instant disclosure.
Figure 3B:
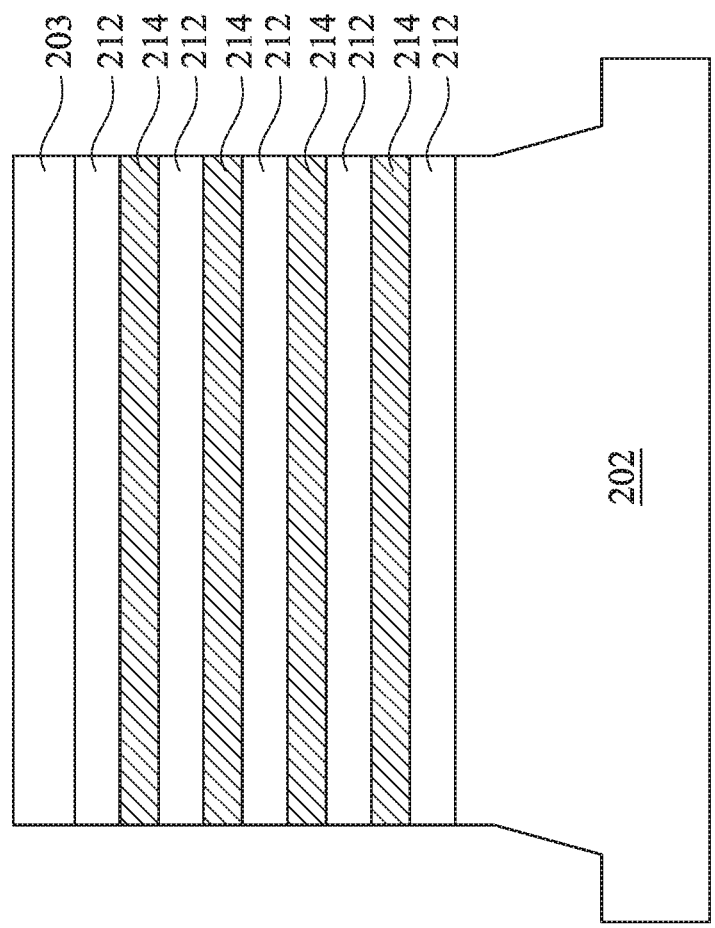
Figure 3C:
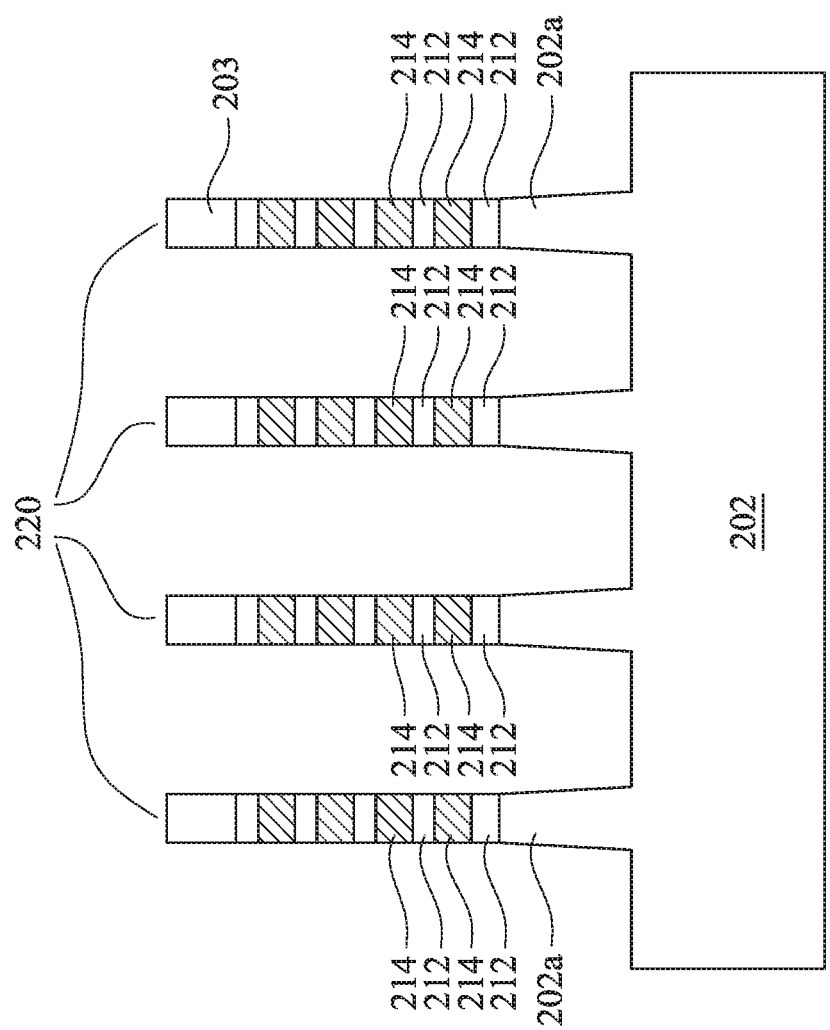

Reference is made to FIGS. 3A-3C and operation 120 in FIG. 1. FIG. 3A is a top view of the structure 200. FIGS. 3B and 3C are cross-sectional views taken along section BB and CC in FIG. 3A respectively. The multi-layer stack 210 is patterned to form fins 220. A hard mask 203 is formed over a portion of the top sacrificial layer 212 resulting in fins 220. The hard mask 203 may initially be formed over the entire top sacrificial layer 212, and selectively removed in the areas in which a FET stacked nanowire device is to be formed. Although the resulting hard mask 203 shown in FIGS. 3A and 3C is patterned into four strips (fins 220) with equal spacing, embodiments are not so limited. The resulting hard mask 203 may be in five, six or more strips, and the spacing between the strips may be varied in other embodiments. The hard mask 203 may be an oxide or nitride for example $SiO_2$ and $SiN_4$. When the multi-layer stack 210 is patterned, a portion of the underlying semiconductor substrate 202 is also removed. As shown in FIG. 3C, the fins 220 include protruded portions 202a of the semiconductor substrate 202.

Figure 4A:
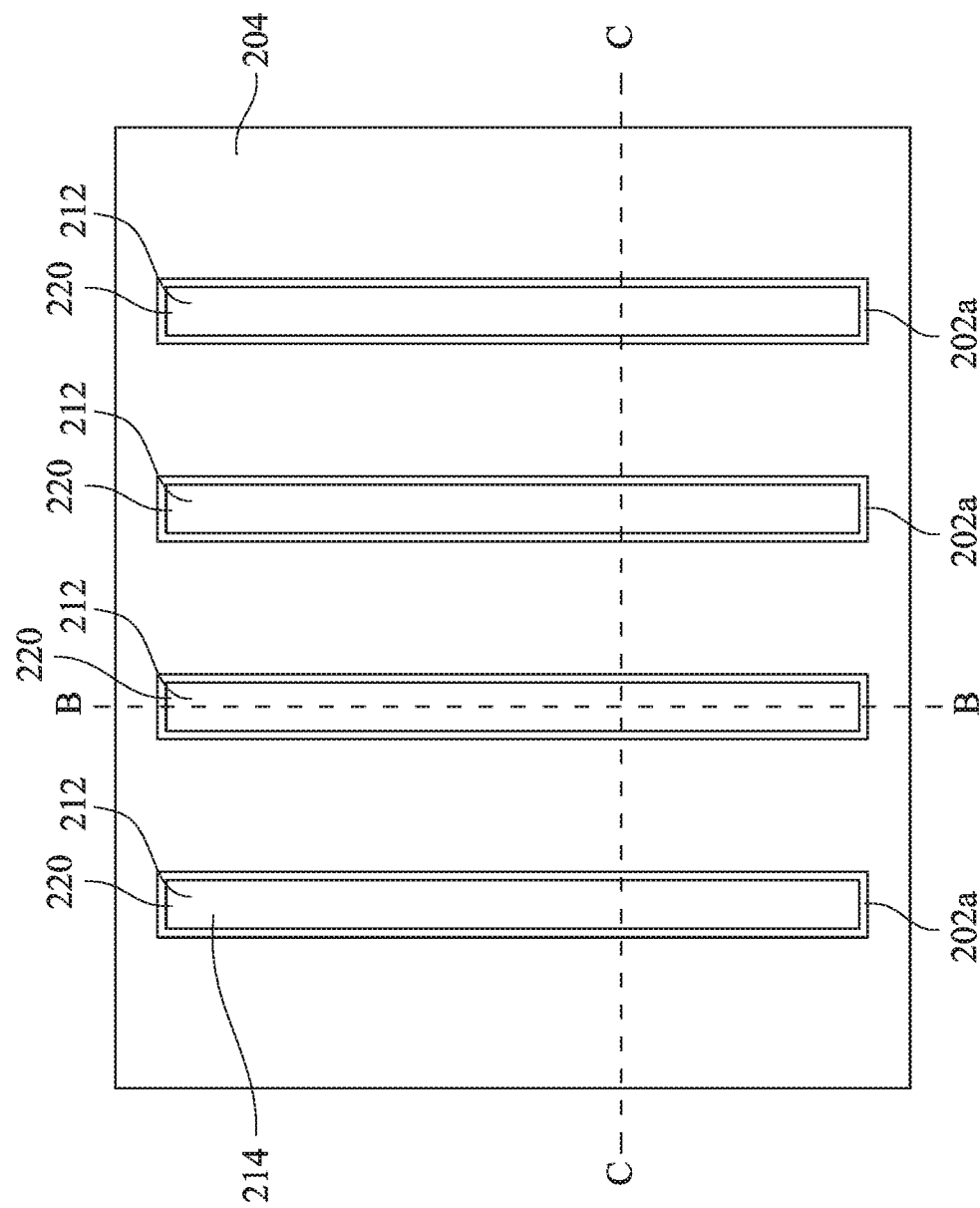
FIGS. 4A-4C illustrate a top view, a cross-sectional view along section BB, and a cross-sectional view along section C-C of the device of FIG. 4A, respectively, in a multi-stack nanowire FET device formation process in accordance with some embodiments of the instant disclosure.
Figure 4B:
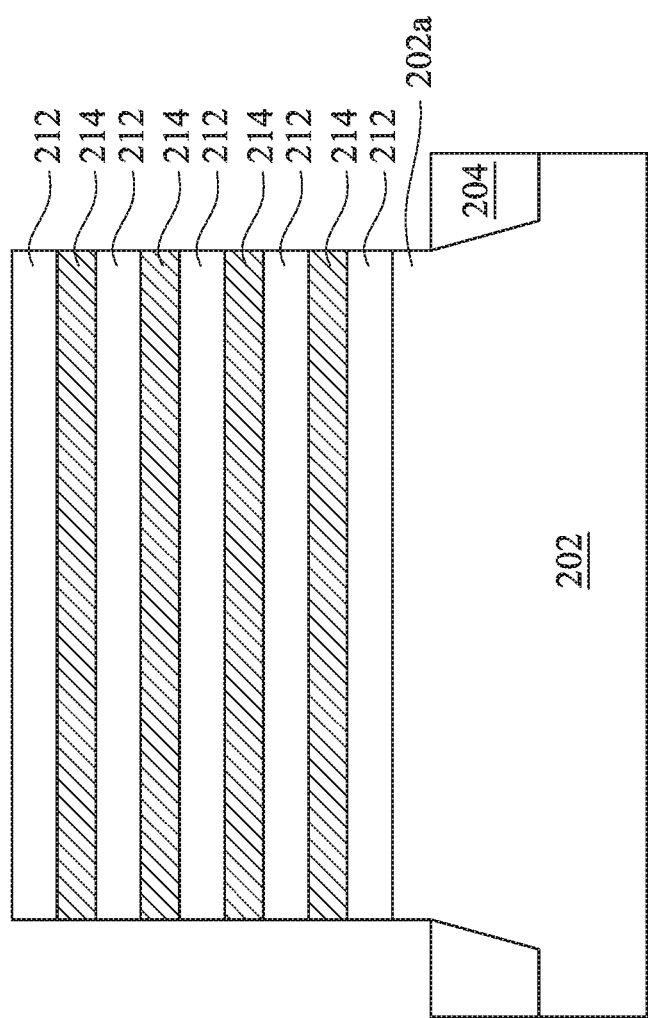
Figure 4C:
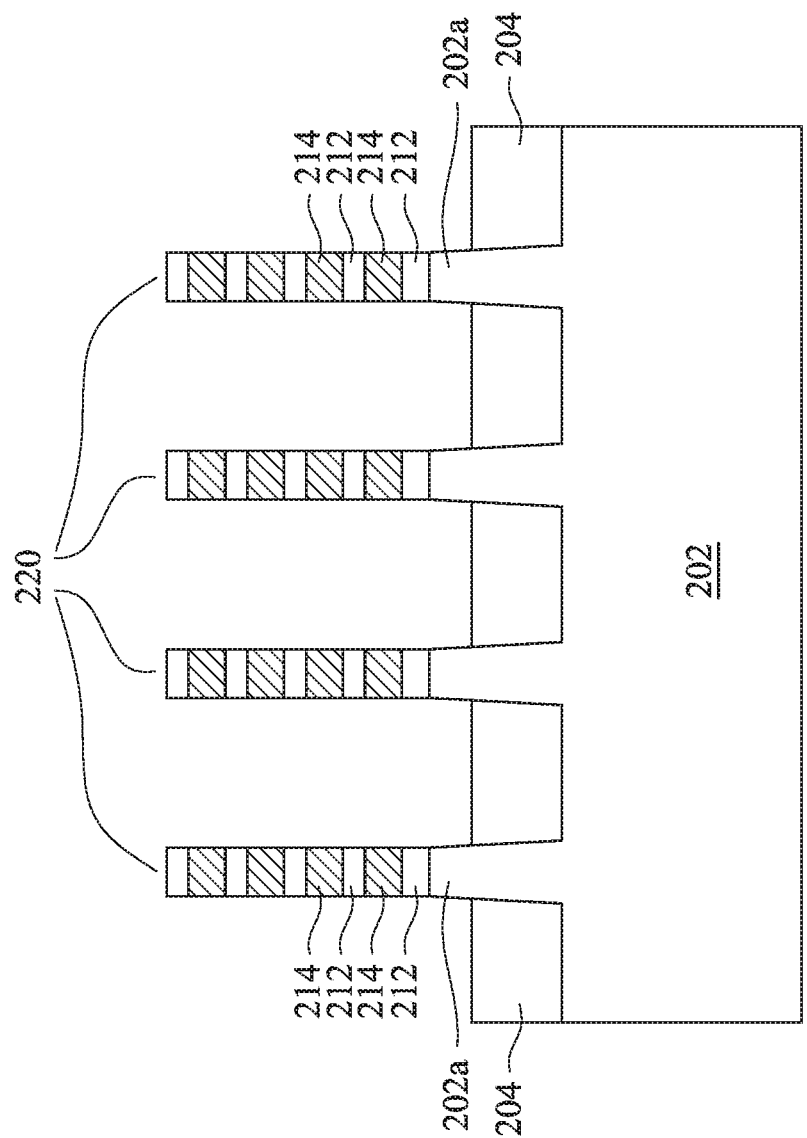

Reference is made to FIGS. 4A-4C. FIG. 4A is a top view of the structure 200. FIGS. 4B and 4C are cross-sectional views taken along section BB and CC in FIG. 4A respectively. The hard mask 203 is removed from the top sacrificial layer 212, and isolation structures 204 are formed. After the removal of the hard mask 203, an oxide is deposited to form isolation structures 204 in the spaces between the fins 220. An etching process is used to recess the oxide into the semiconductor substrate 202 at the base of the fins 220. The fins 220 are completely exposed above the isolation structures 204. A top portion of the protruded portion 202a of the semiconductor substrate 202 is not covered by the isolation structures 204. As shown in FIG. 4C, from the top surface of the isolation structures 204, a total of five Si layers including four nanowires 214 are exposed. The sacrificial layer 212 now caps the fins 220.

Figure 5A:
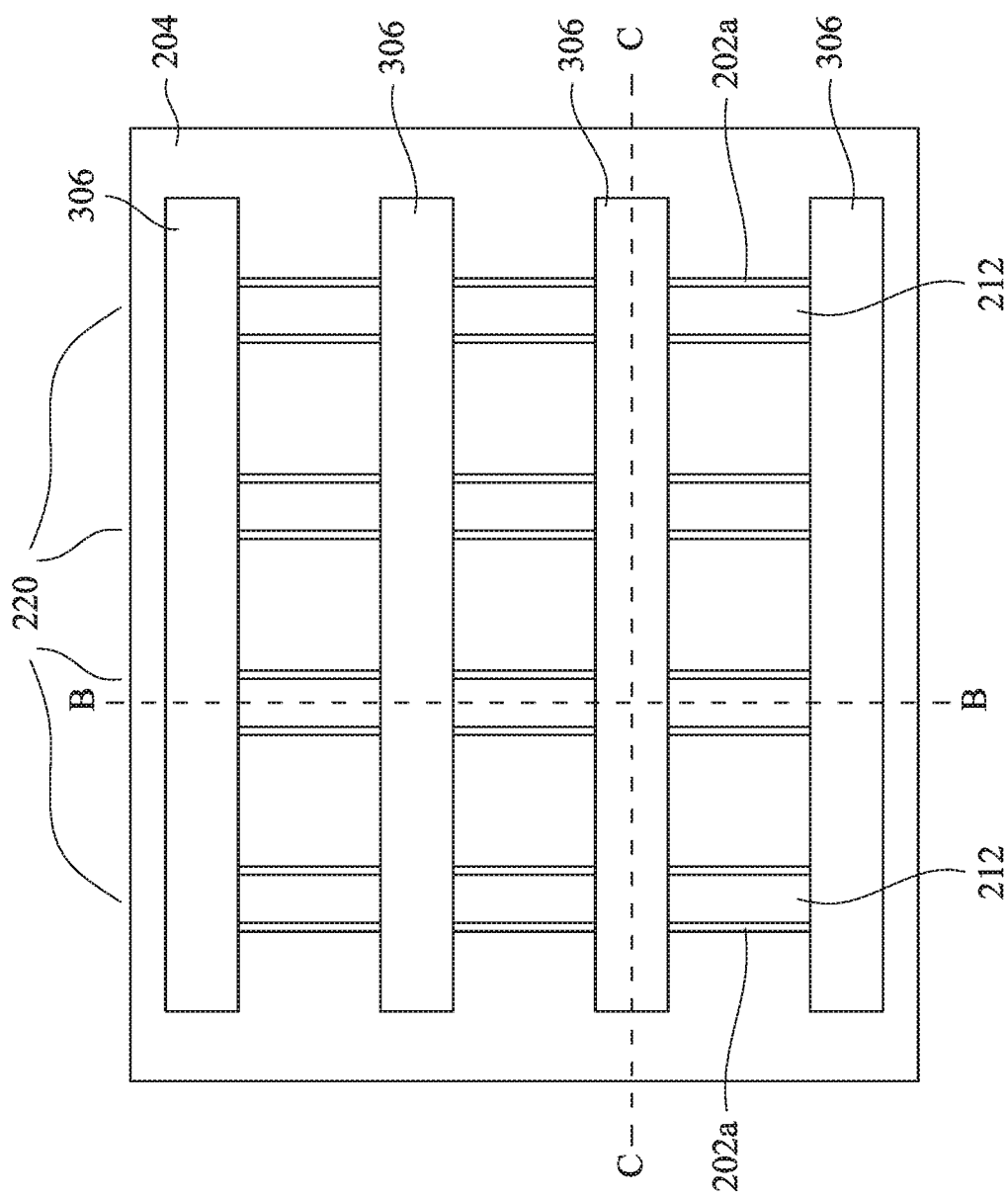
Figure 5C:
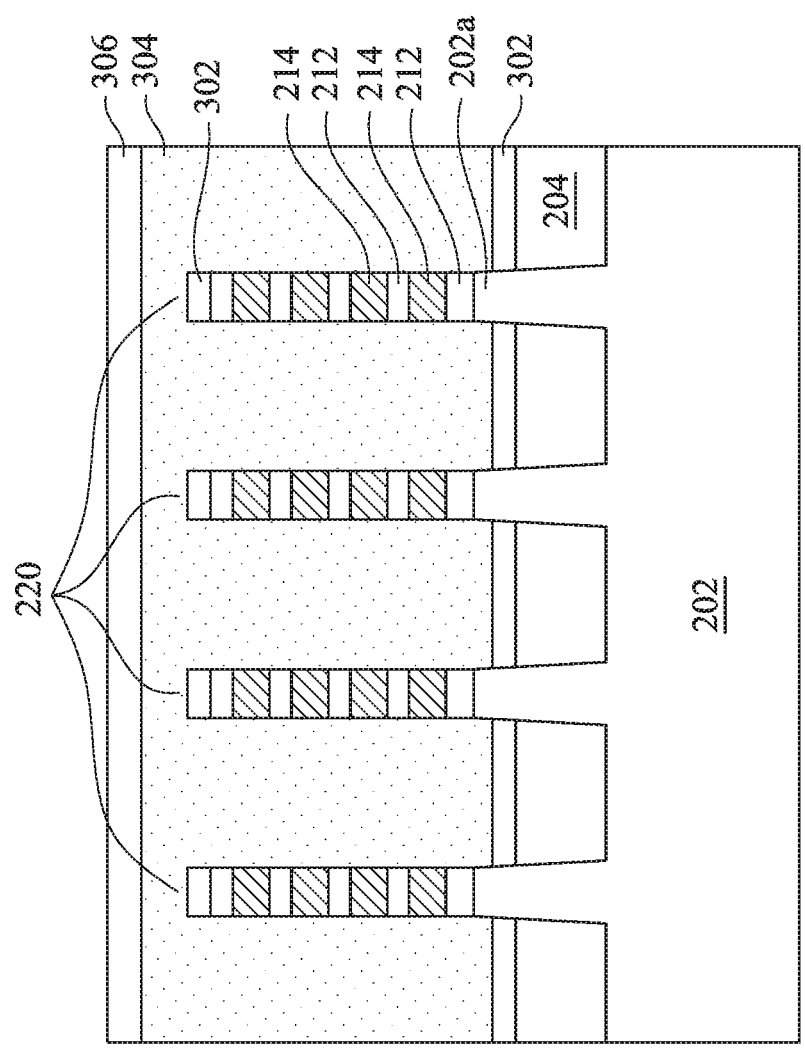

Reference is made to FIGS. 5A-5C. FIG. 5A is a top view of the structure 200. FIGS. 5B and 5C are cross-sectional views taken along section BB and CC in FIG. 5A respectively. Dummy gates 310 are formed over channel regions 220a of the fins 220. The dummy gates 310 may include a dielectric layer 302, a polysilicon layer 304, and an oxide or nitride hard mask 306. Other materials may also be used. In some embodiments, the dummy gates 310 are deposited as a blanket layer and then patterned. FIGS. 5A and 5B, as an example, four rows of dummy gates 310 (hard mask 306 is shown in top view FIG. 5A) are formed across the fins 220. That is, the fins 220 go along a first direction and the dummy gates 310 go along a second direction. The first and second directions are substantially perpendicular to each other. The dummy gates 310 define the channel regions 220a of the fins 220. As shown in FIG. 5A, the dummy gates 310 at either ends of the fins 220 anchor the fins 220, and therefore the anchoring dummy gates 310 have a portion over the fins 220 and the remaining portion touches down to the isolation structures 204.

Figure 6B:
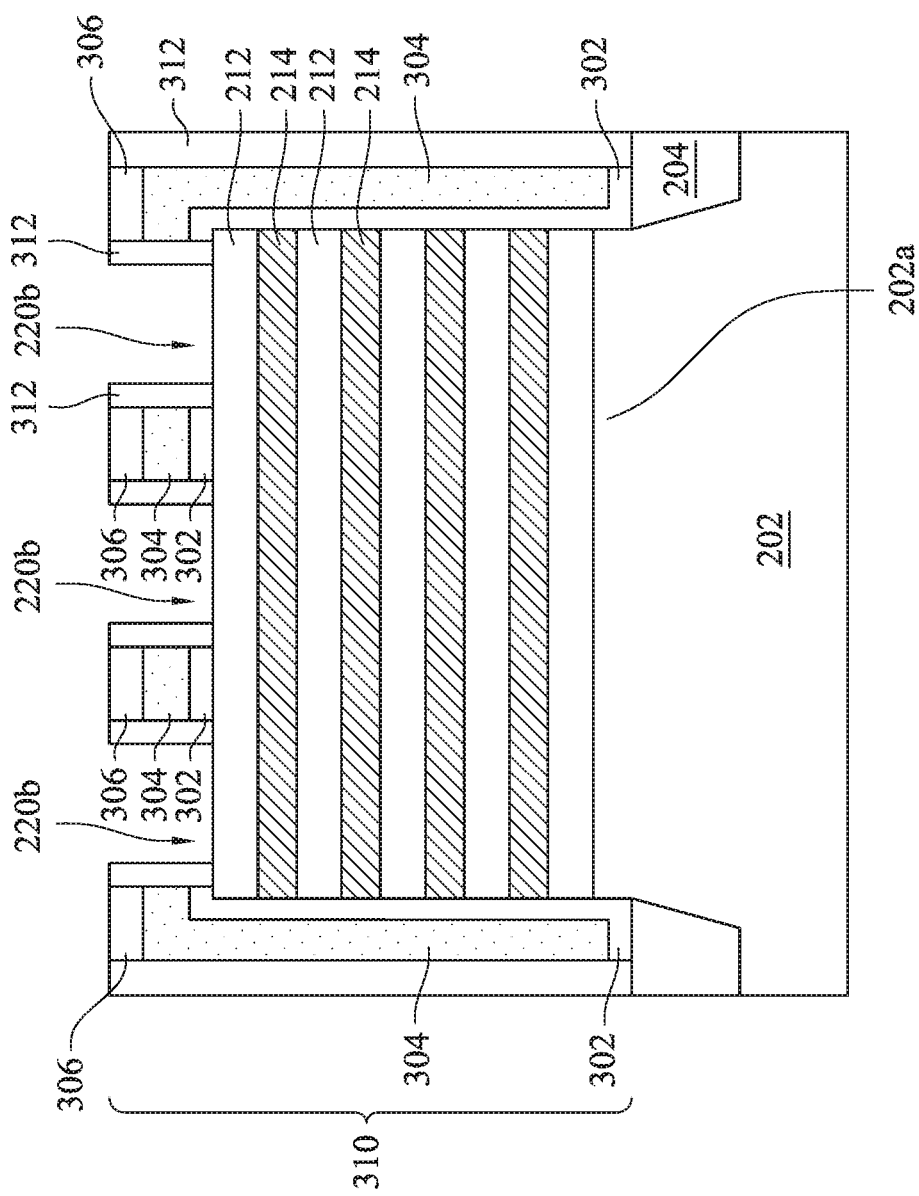
Figure 6C:
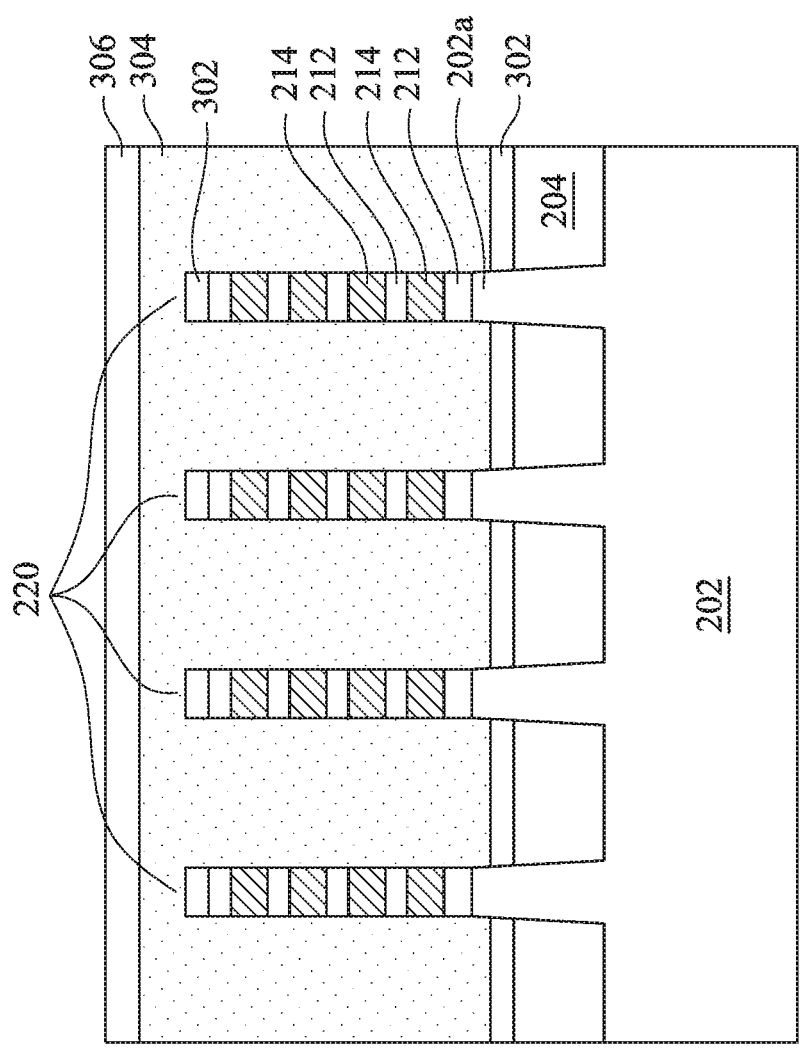

Reference is made to FIGS. 6A-6C. FIG. 6A is a top view of the structure 200. FIGS. 6B and 6C are cross-sectional views taken along section BB and CC in FIG. 6A respectively. After dummy gates 310 deposition, spacers 312 are formed on both sides of the dummy gates 310. The spacers 312 are formed by depositing an insulation layer (such as oxide or nitride) and then anisotropically etching from the surface. The etching process removes spacer layer from fin side walls. Spacers 312 are formed on the sides of the dummy gates 310, and spaces are left between the spacers 312 as shown in FIG. 6B. The spaces left between the spacers 312 define the source and drain regions 220b on the fins 220.

Still referring to FIGS. 6A-6C, the source and drain regions 220b of fins 220, which are between the spaces left between the spacers 312, are doped. The source and drain regions 220b of the fins 220 are doped by, for example, epi or plasma doping. N-type doping is used for the NFET devices in the fins 220, and p-type doping is used for the PFET devices in the fins 220. As shown in FIGS. 6A and 6B, the source and drain regions 220b of fins 220 are not covered by the dummy gates 310, and they are converted into the source and drain regions after doping. As shown in FIG. 6B, the dummy gates 310 are used as a mask where the channel regions 220a are located. For the sake of clarity, spacers 312 are not shown in FIG. 6C and the following cross-sectional views along section CC.

Figure 7A:
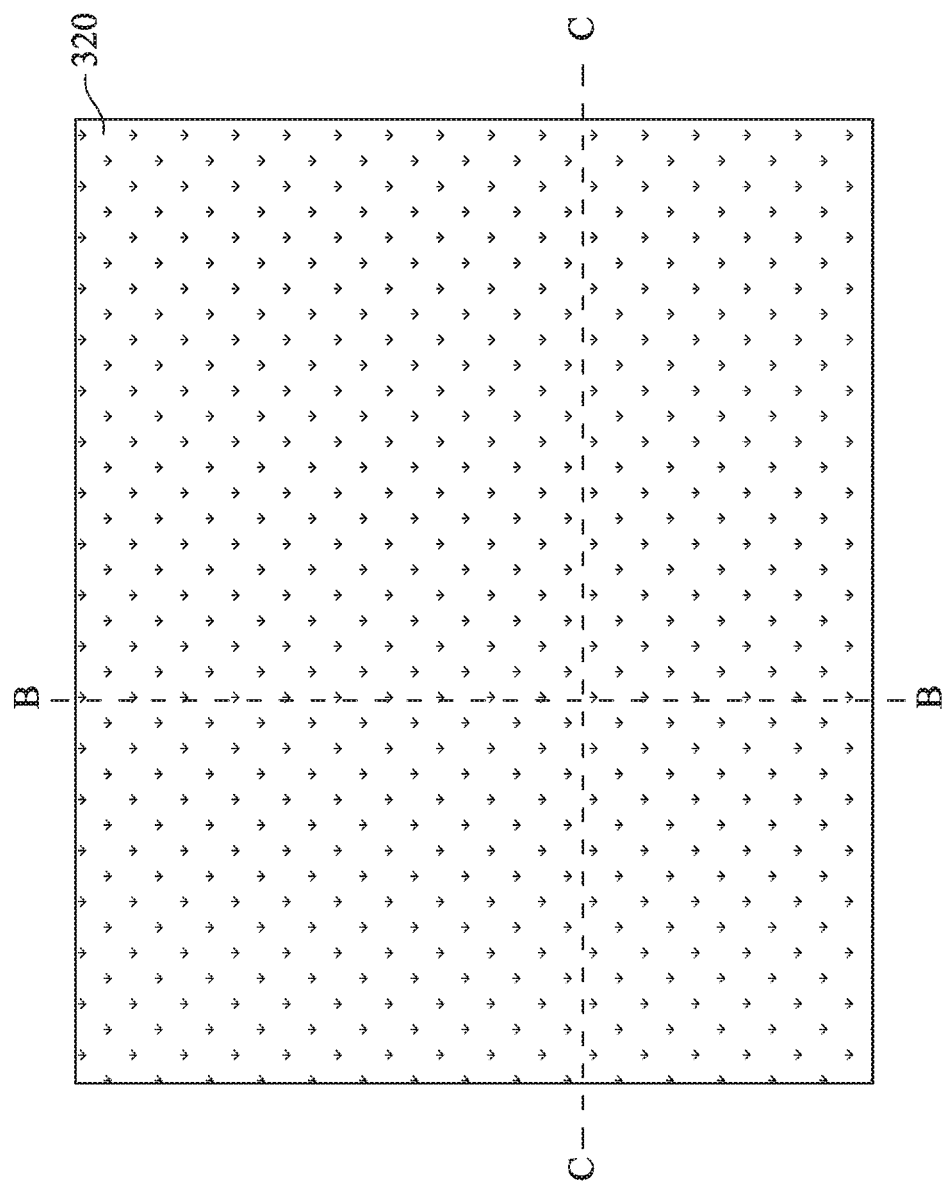
Figure 7B:
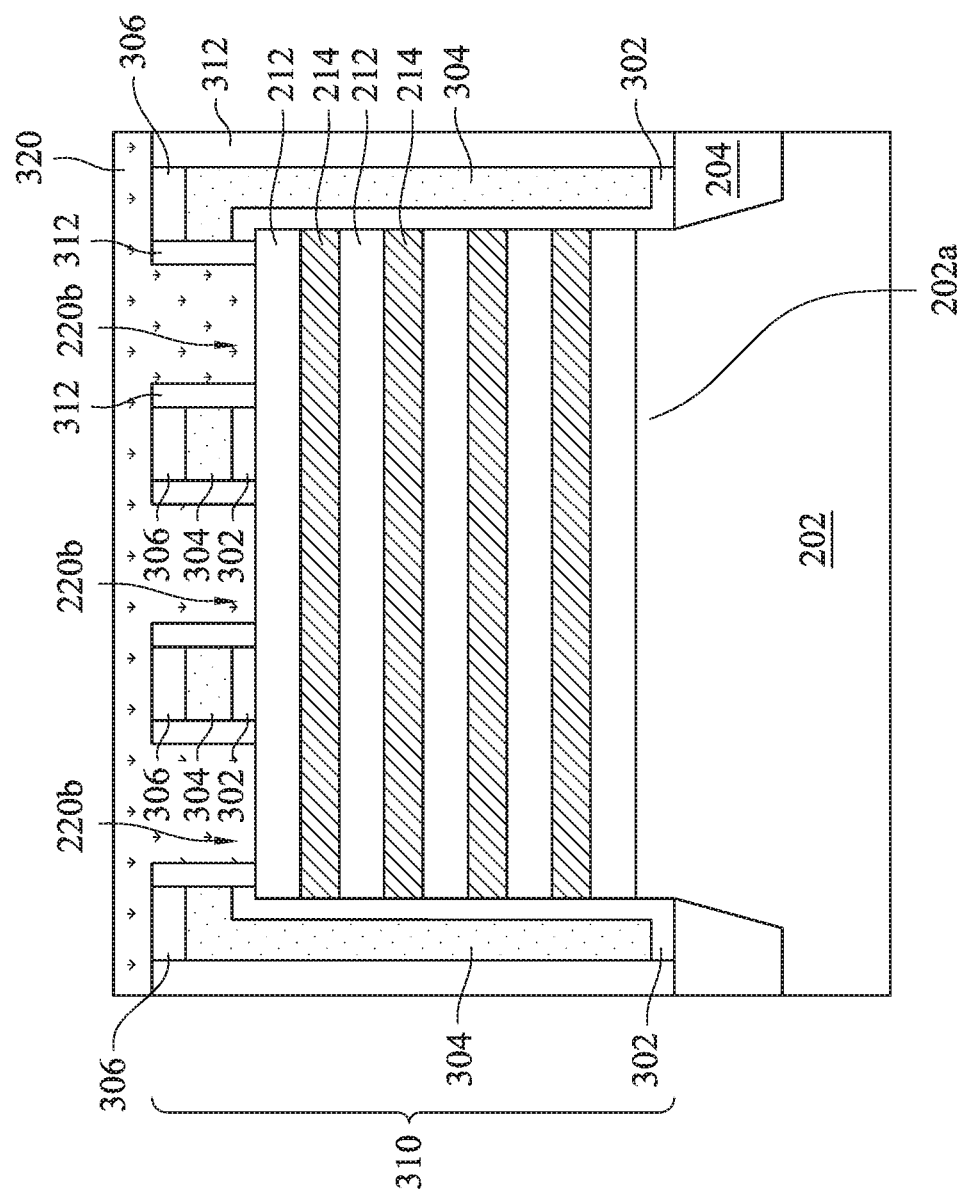

Reference is made to FIGS. 7A-7C. FIG. 7A is a top view of the structure 200. FIGS. 7B and 7C are cross-sectional views taken along section BB and CC in FIG. 7A respectively. A first interlayer dielectric layer 320 is deposited on the semiconductor substrate 202. The first interlayer dielectric layer 320 is blanket deposited on the semiconductor substrate 202 and fills in the spaces left between the spacers 312 on the fin side walls. The source and drain regions 220b of the fins 220 are then covered by the first interlayer dielectric layer 320. As shown in FIG. 7A, the first interlayer dielectric layer 320 covers up the spacers 312 and the dummy gates 310.

Figure 8A:
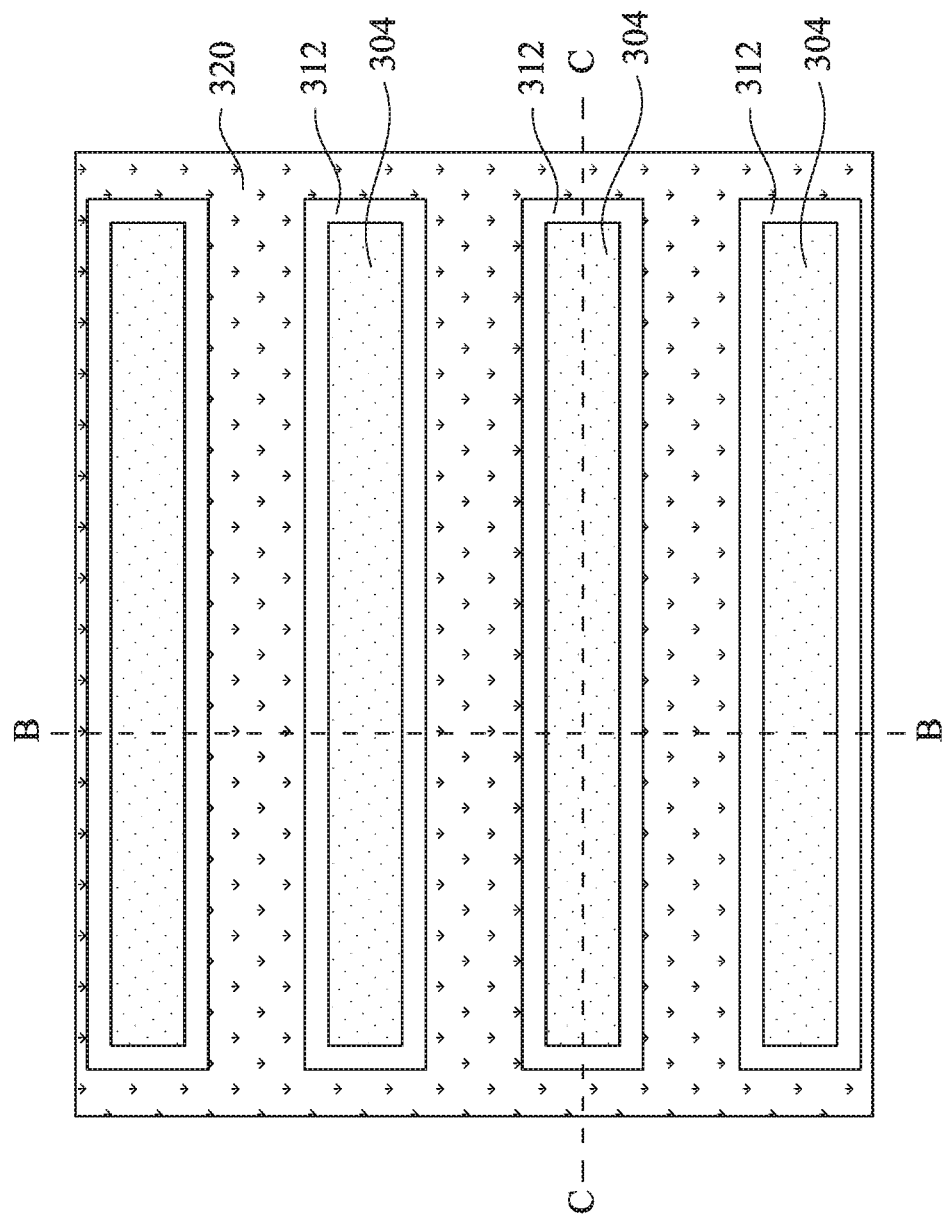
FIGS. 8A-8C illustrate a top view, a cross-sectional view along section BB, and a cross-sectional view along section C-C of the device of FIG. 8A, respectively, in a multi-stack nanowire FET device formation process in accordance with some embodiments of the instant disclosure.
Figure 8B:
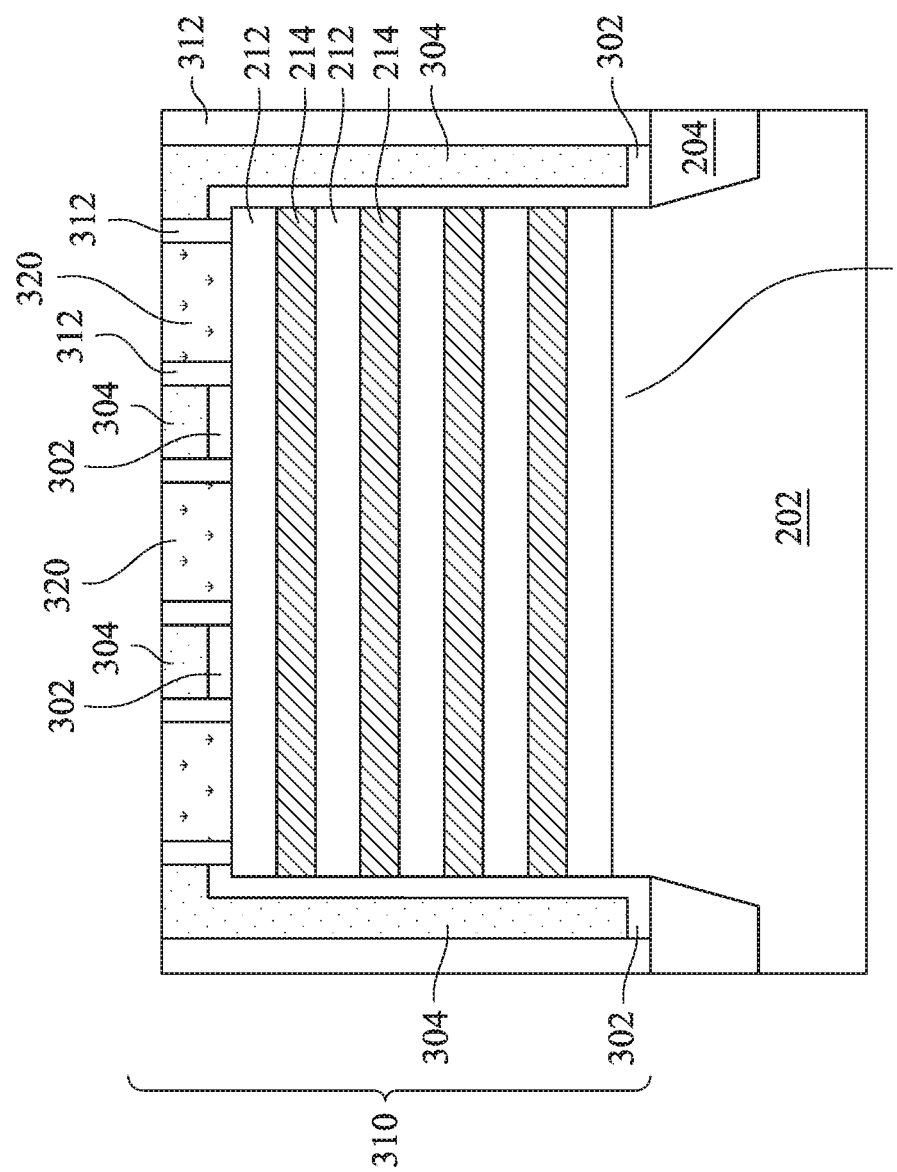
Figure 8C:
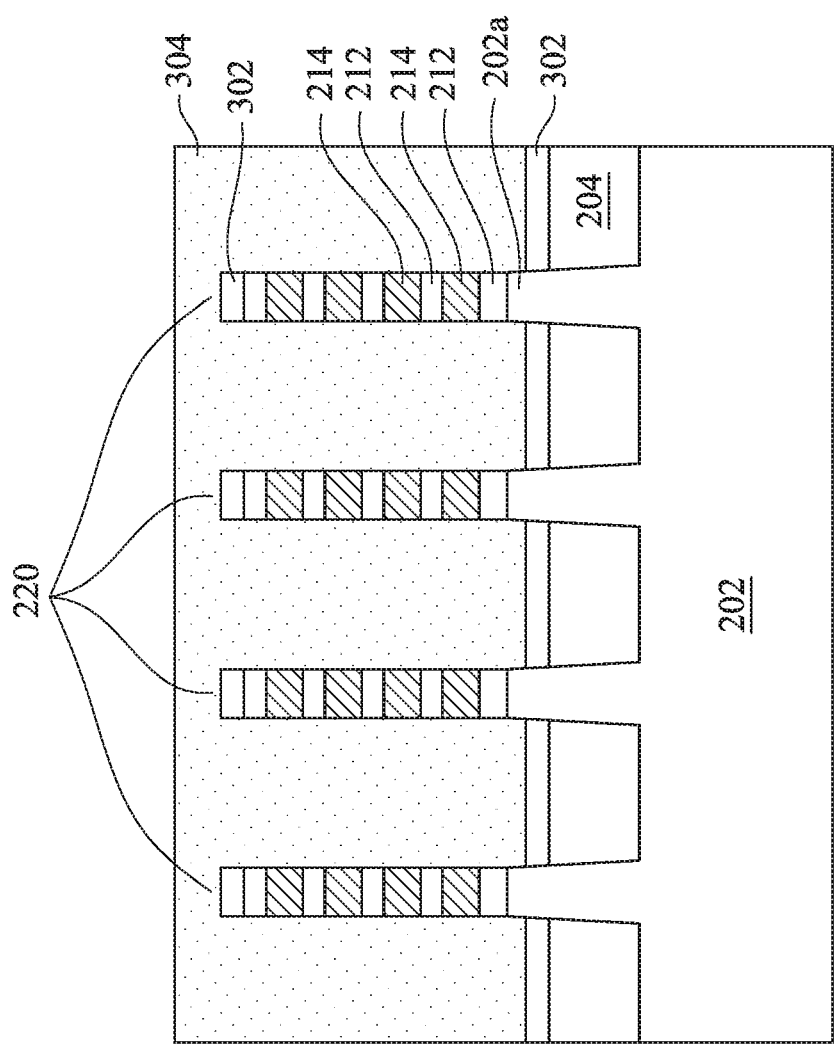

Reference is made to FIGS. 8A-8C. FIG. 8A is a top view of the structure 200. FIGS. 8B and 8C are cross-sectional views taken along section BB and CC in FIG. 8A respectively. A planarization process is performed to the semiconductor substrate 202. The planarization process may be chemical mechanical polishing or any other suitable process. Portions of the first interlayer dielectric layer 320 are removed. The first interlayer dielectric layer 320 between the spacers 312 on the fin side walls remains. As shown in FIG. 8B, in the planarization process, the hard masks 306 of the dummy gates 310 and portions of the spacers 312 are removed. On top of the source and drain regions 220b of the fins 220, a layer of the first interlayer dielectric layer 320 remains. As shown in FIG. 8C, the channel regions 220a are covered by the dielectric layer 302 and the polysilicon layer 304.

Figure 9A:
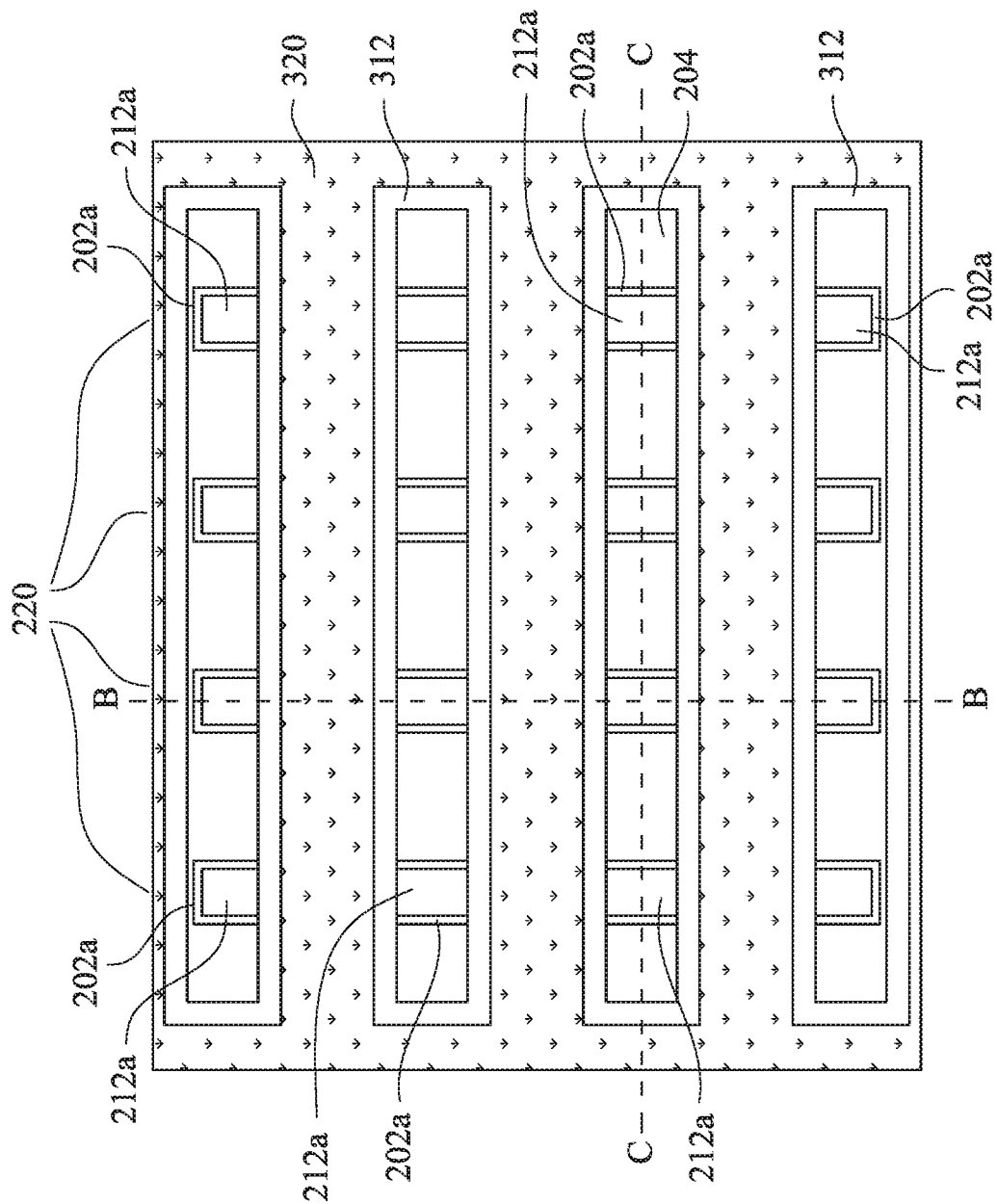
FIGS. 9A-9C illustrate a top view, a cross-sectional view along section BB, and a cross-sectional view along section C-C of the device of FIG. 9A, respectively, in a multi-stack nanowire FET device formation process in accordance with some embodiments of the instant disclosure.
Figure 9B:
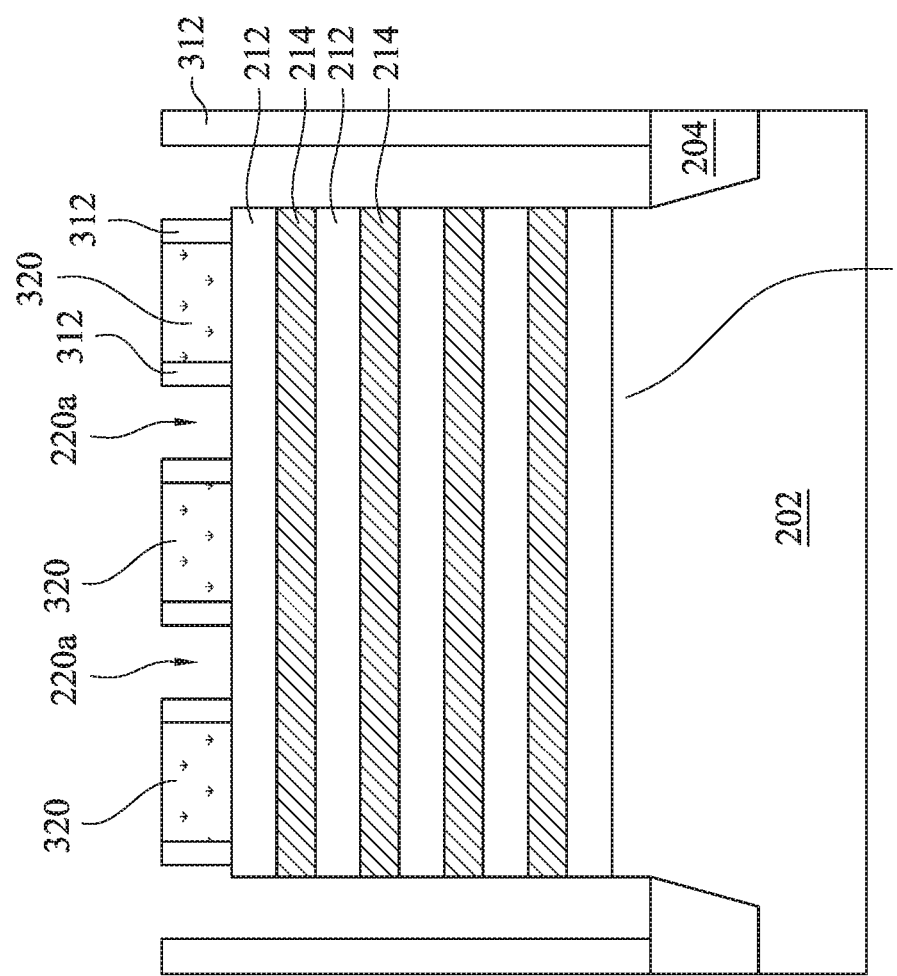
Figure 9C:
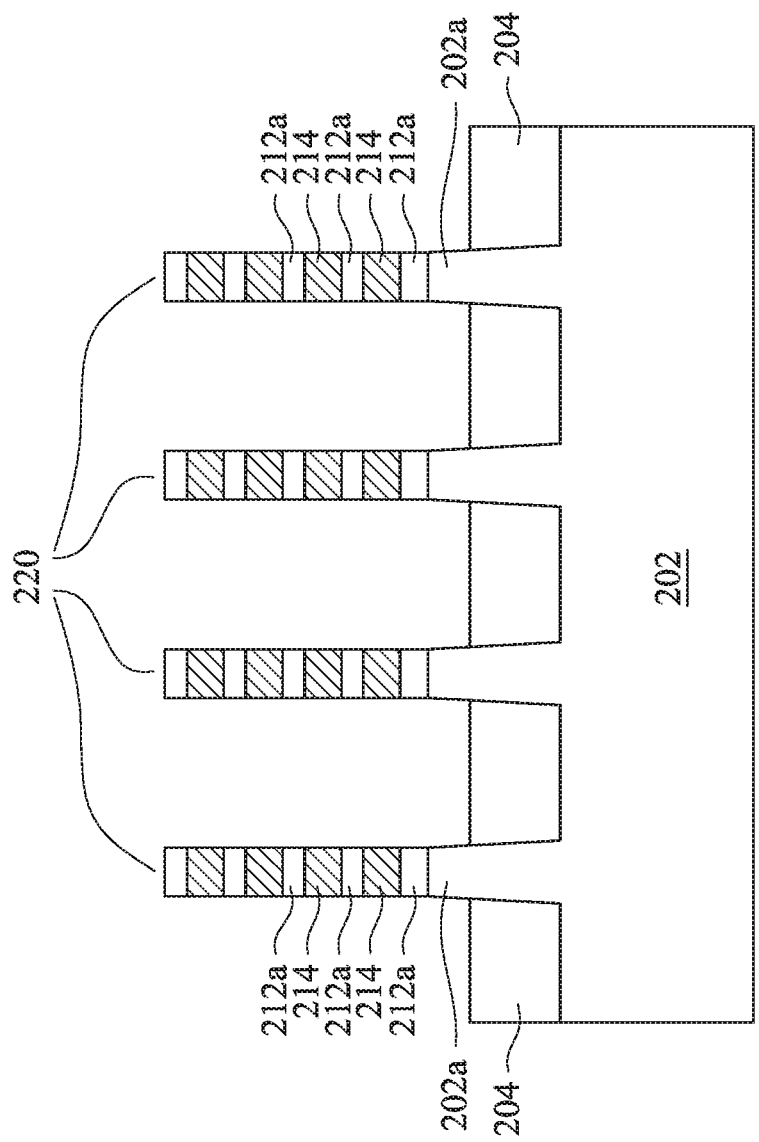

Reference is made to FIGS. 9A-9C. FIG. 9A is a top view of the structure 200. FIGS. 9B and 9C are cross-sectional views taken along section BB and CC in FIG. 9A respectively. After planarization, the dummy gates 310 are removed, but the spacers 312 remain. The channel regions 220a of the fins 220 are then exposed, while the source and drain regions 220b of the fins 220 are still under the coverage of the first interlayer dielectric layer 320.

Figure 10A:
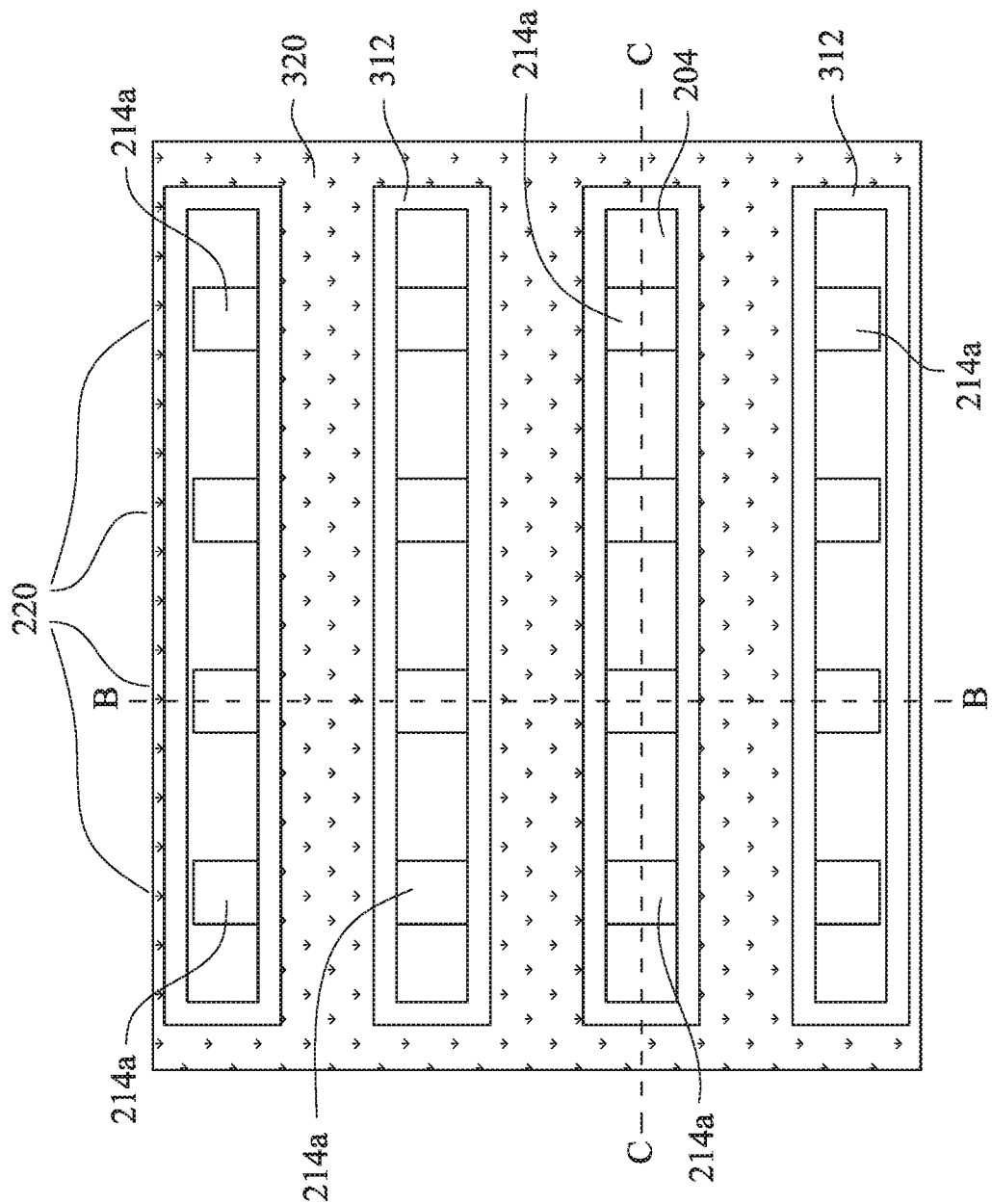
FIGS. 10A-10C illustrate a top view, a cross-sectional view along section BB, and a cross-sectional view along section C-C of the device of FIG. 10A, respectively, in a multi-stack nanowire FET device formation process in accordance with some embodiments of the instant disclosure.
Figure 10B:
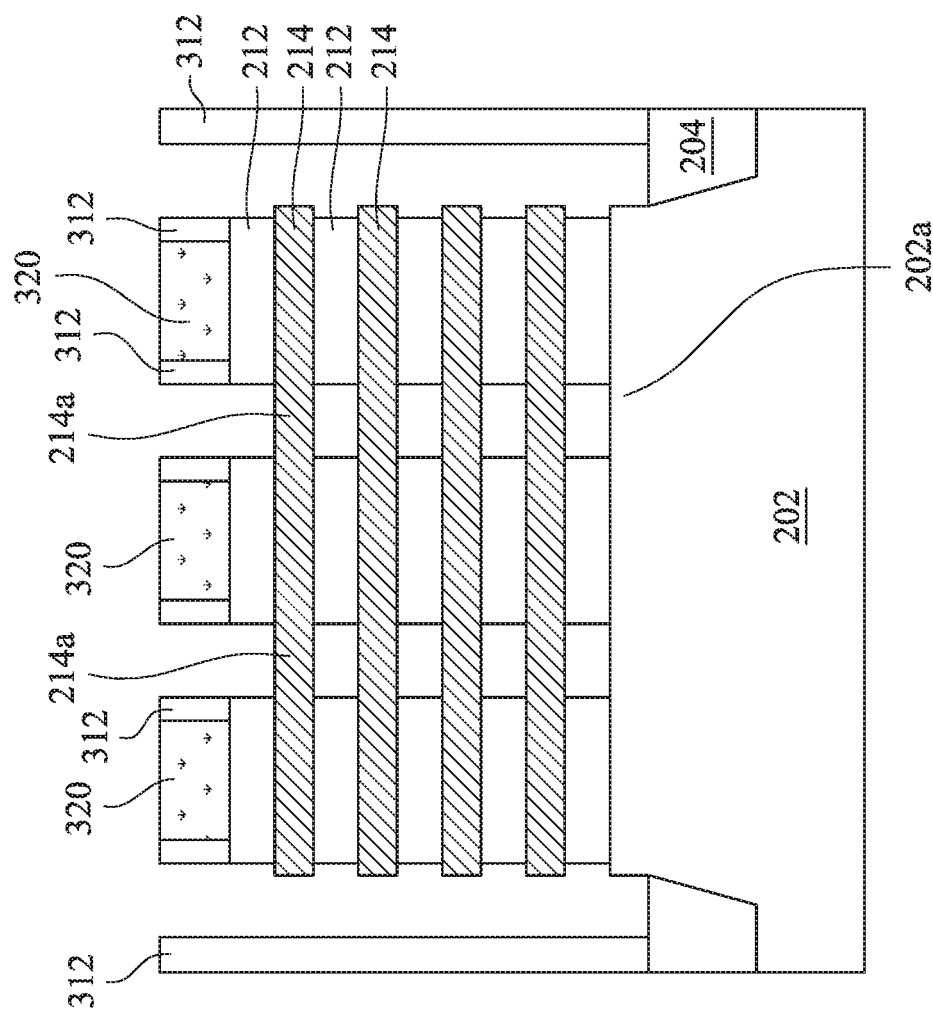
Figure 10C:
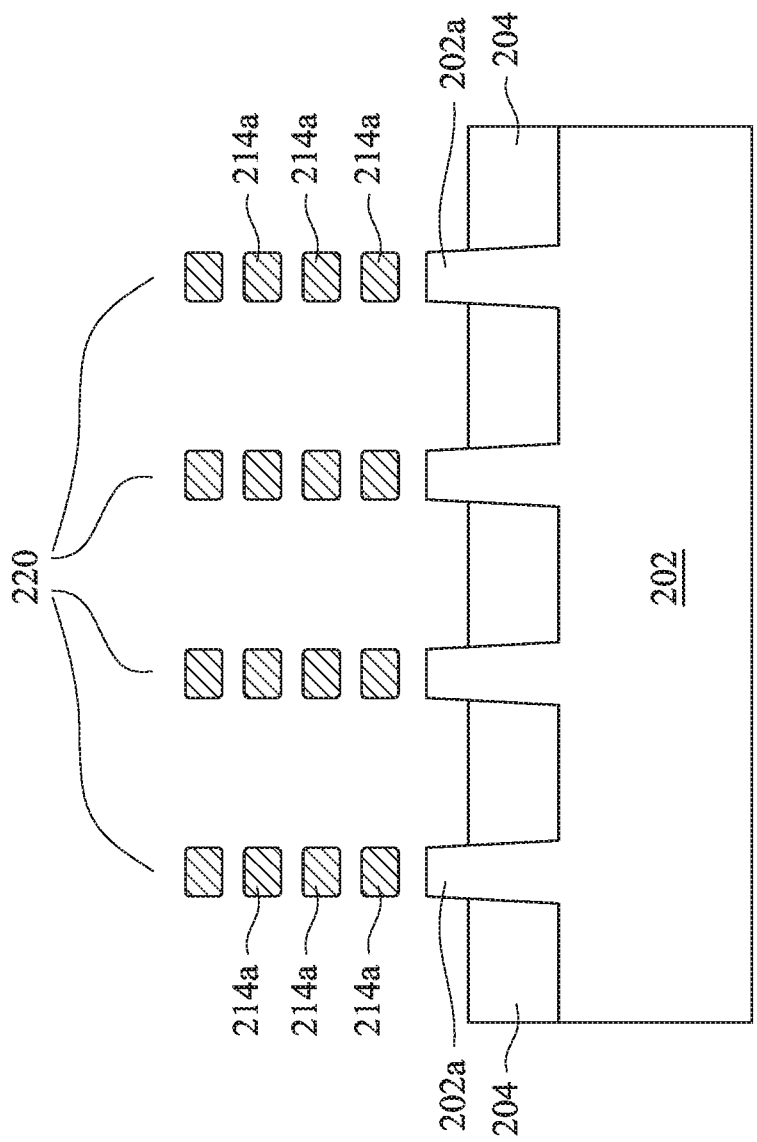

Reference is made to FIGS. 10A-10C and operation 130 in FIG. 1. FIG. 10A is a top view of the structure 200. FIGS. 10B and 10C are cross-sectional views taken along section BB and CC in FIG. 10A respectively. After removal of the dummy gates 310, first portions 212a of the sacrificial layers 212 are removed. The first portions 212a of the sacrificial layer correspond to the channel regions 220a of the fins 220. As shown in FIG. 10A, the first portion 212a of the top sacrificial layer 212 is removed, leaving the underlying nanowire 214 exposed. The sacrificial layers 212 between the nanowires 214 are also removed. Attention is invited to FIG. 10B. The sacrificial layers 212 under the coverage of the first interlayer dielectric layer 320 remain in place. On the other hand, the first portions 212a of the sacrificial layer, which are not under the spacers 312 and first interlayer dielectric layers 320 remains. The first portions 214a of the nanowires 214 are exposed and spaced apart from each other. Attention is invited to FIG. 10C. After the removal of the first portions 212a of the sacrificial layers 212, spaces are left between the nanowires 214.

Figure 11A:
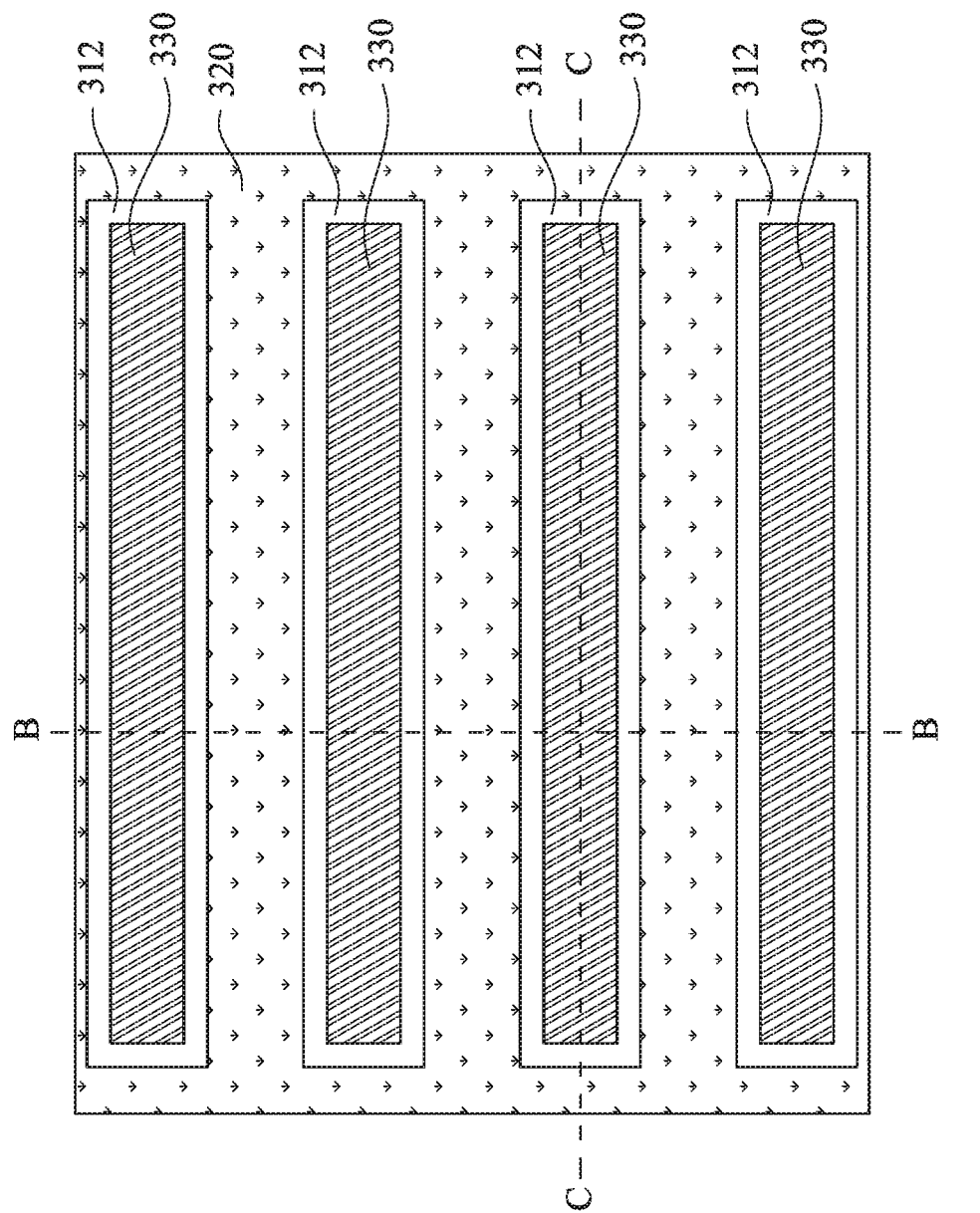
FIGS. 11A-11C illustrate a top view, a cross-sectional view along section BB, and a cross-sectional view alone section C-C of the device of FIG. 11A, respectively, in a multi-stack nanowire FET device formation process in accordance with some embodiments of the instant disclosure.
Figure 11B:
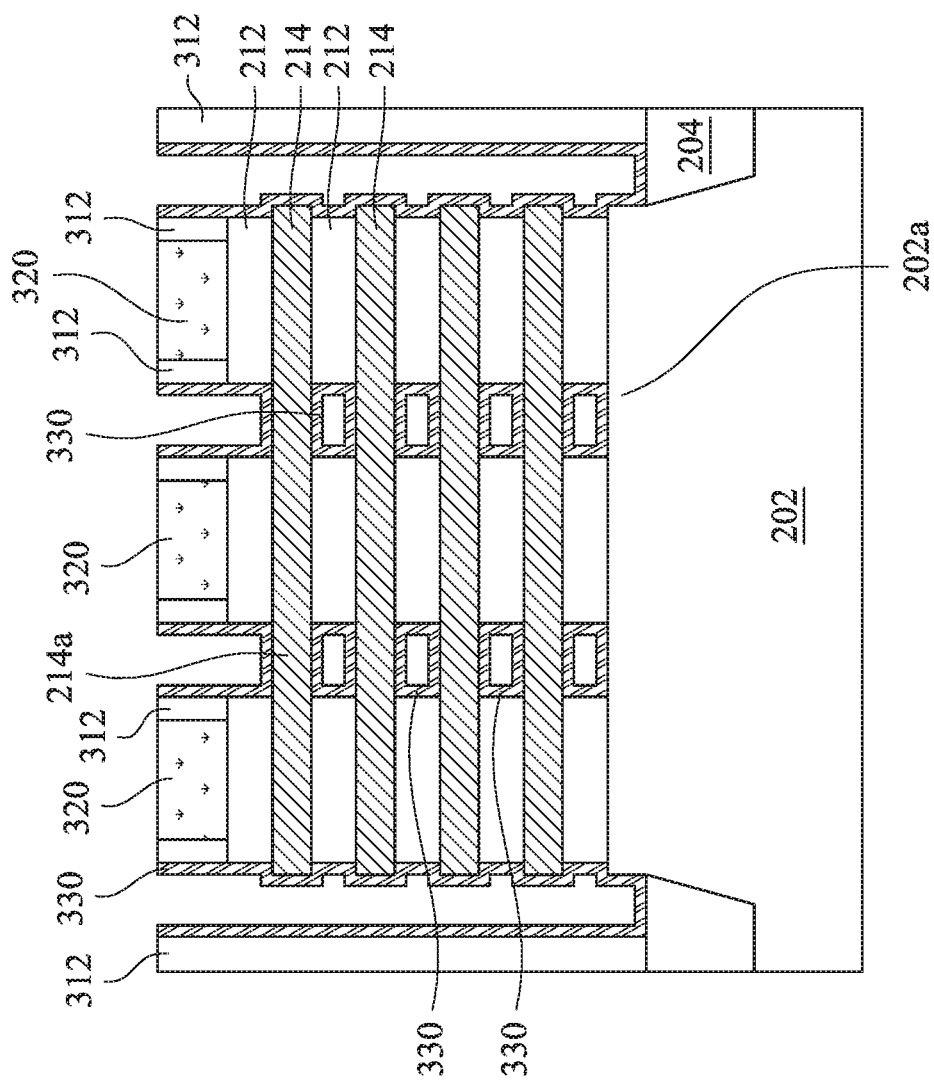
Figure 11C:
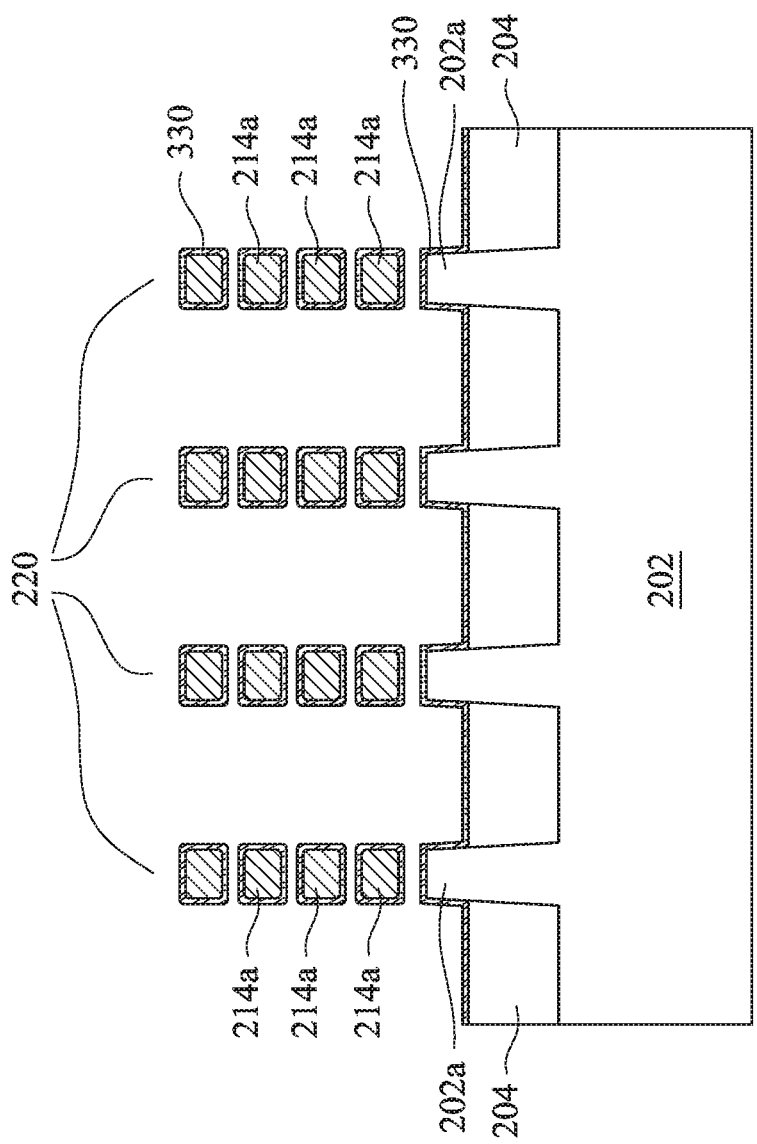

Reference is made to FIGS. 11A-11C and Operation 140 of FIG. 1. FIG. 11A is a top view of the structure 200. FIGS. 11B and 11C are cross-sectional views taken along section BB and CC in FIG. 11A respectively. A high-k gate dielectric layer 330 is formed on the first portions 214a of the nanowires 214. The high-k gate dielectric layer 330 is a thin layer formed on the exposed surfaces including the sidewalls of the spacers 312 and first portions 214a of the nanowires 214. The high-k gate dielectric layer 330 includes a material such as hafnium oxide (HfO$_2$), zirconium oxide (ZrO$_2$) or lanthanum oxide (La$_2$O$_3$). As shown in FIG. 11C, the high-k gate dielectric layer 330 wraps around the first portions 214a of each of the nanowires 214. The surface of the isolation structures 204 and the protruded portions 202a of the semiconductor substrate 202 are also covered by the high-k gate dielectric layer 330. Spaces between the nanowires 214 are still left after the deposition of the high-k gate dielectric layer 330.

Figure 12A:
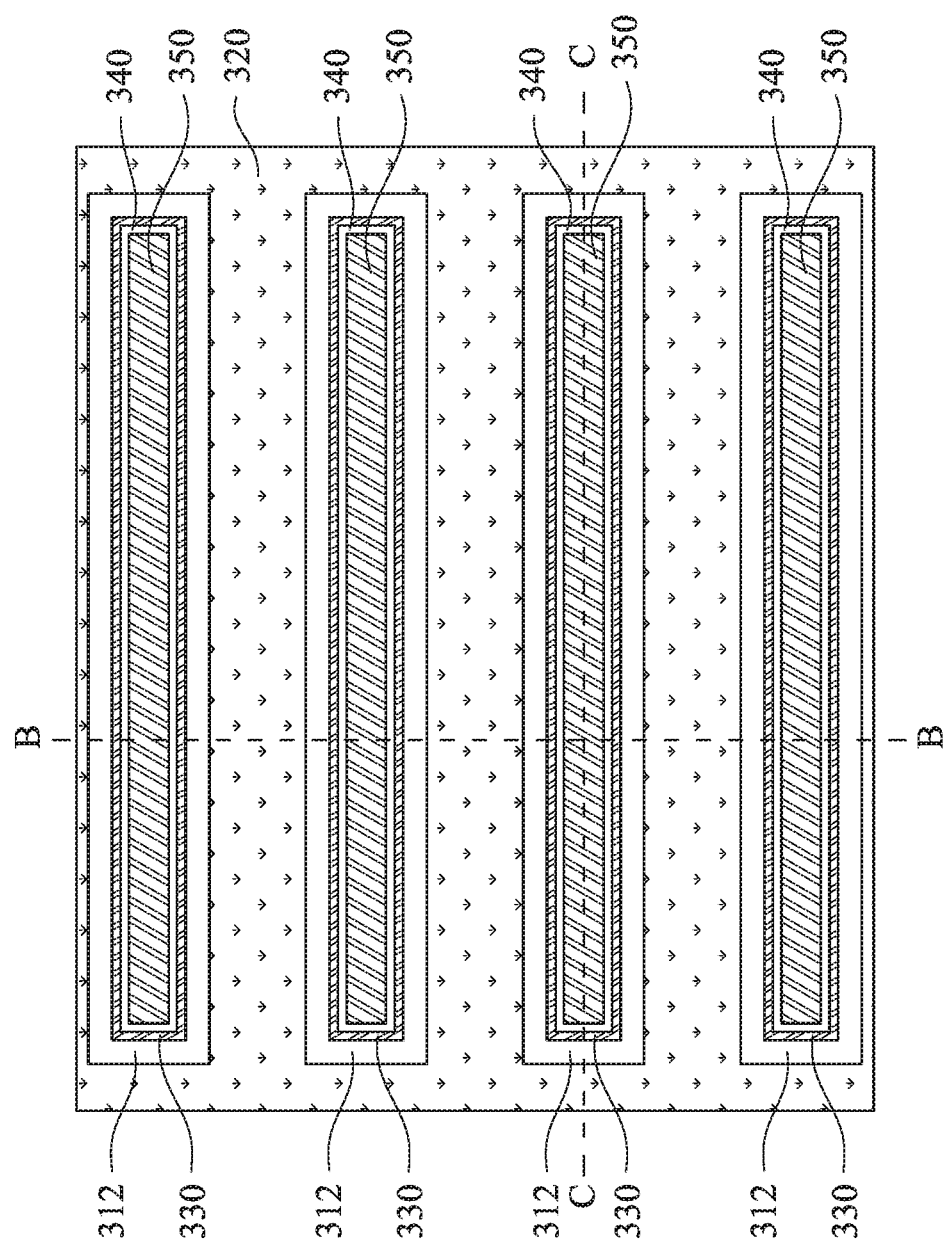
FIGS. 12A-12C illustrate a top view, a cross-sectional view along section BB, and a cross-sectional view along section C-C of the device of FIG. 12A, respectively, in a multi-stack nanowire FET device formation process in accordance with some embodiments of the instant disclosure.
Figure 12B:
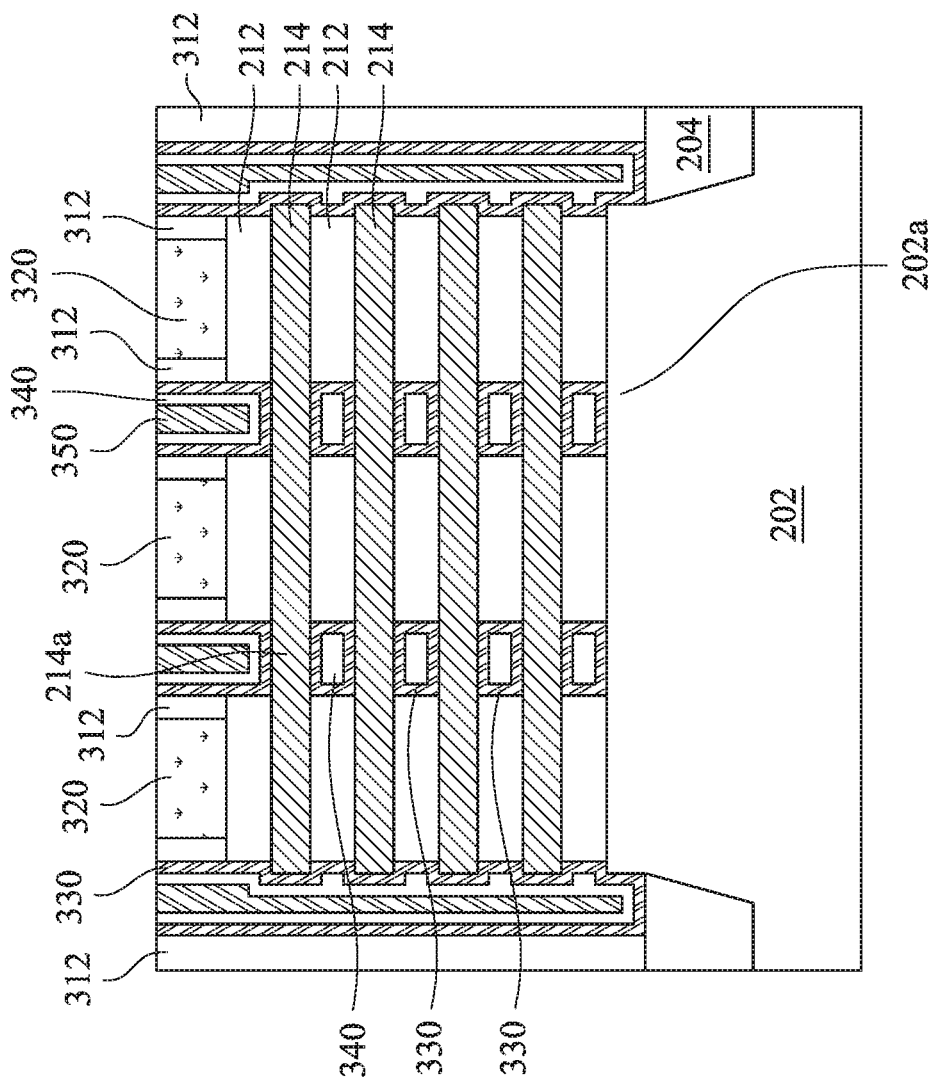
Figure 12C:
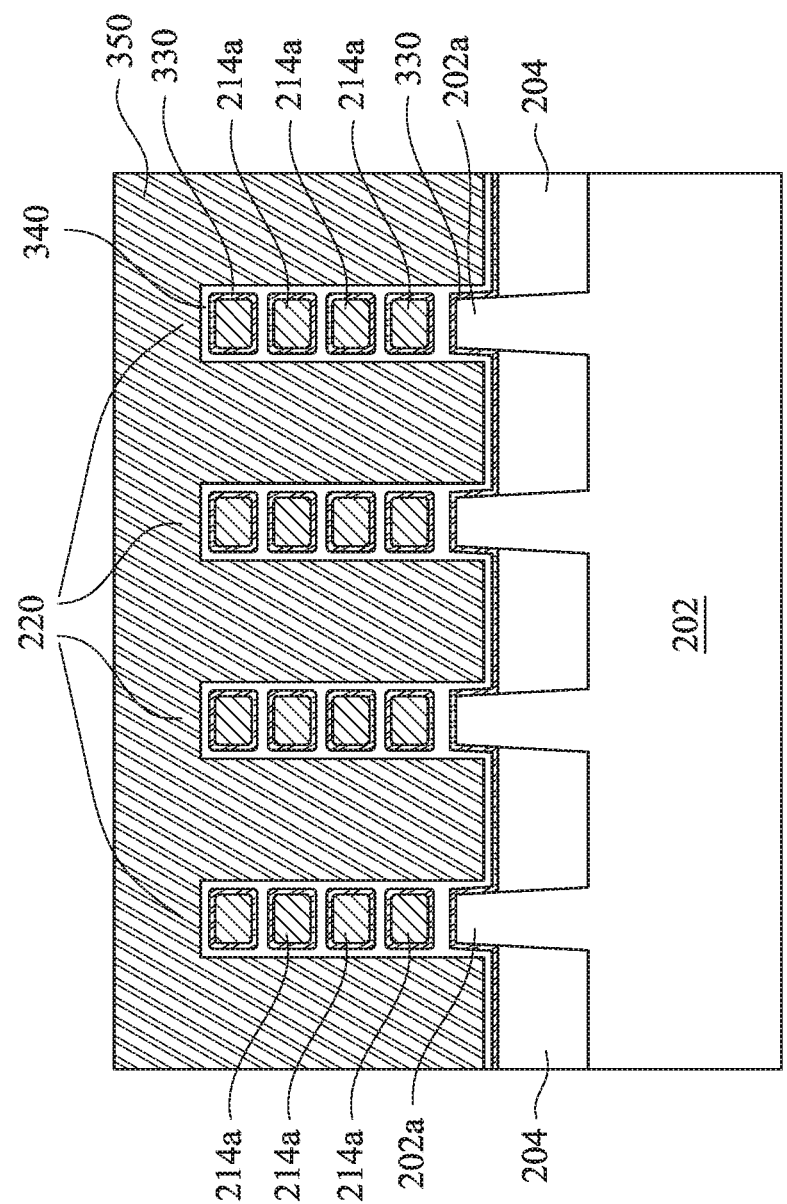

Reference is made to FIGS. 12A-12C and operation 140 in FIG. 1. FIG. 12A is a top view of the structure 200. FIGS. 12B and 12C are cross-sectional views taken along section BB and CC in FIG. 12A respectively. A work function metal layer 340 and a gate electrode 350 are formed. The work function metal layer 340 may include materials such as titanium nitride (TiN) or tantalum nitride (TaN). The gate electrode 350 may include material such as tungsten or aluminum. As shown in FIG. 12B, the work function metal layer 340 fills up the spaces between the nanowires 214a replacing the first portions 212a of the sacrificial layers 212. Subsequently, as shown in FIG. 12C, the gate electrode 350 fills up the spaces surrounding the nanowires, thereby completely wrapping around the first portions 214a of the nanowires 214. The gate electrode 350 replaces the dummy gates 310. It is understood the first portions 214a of the nanowires 214 corresponds to the channel regions 220a of the fins 220.

Figure 13A:
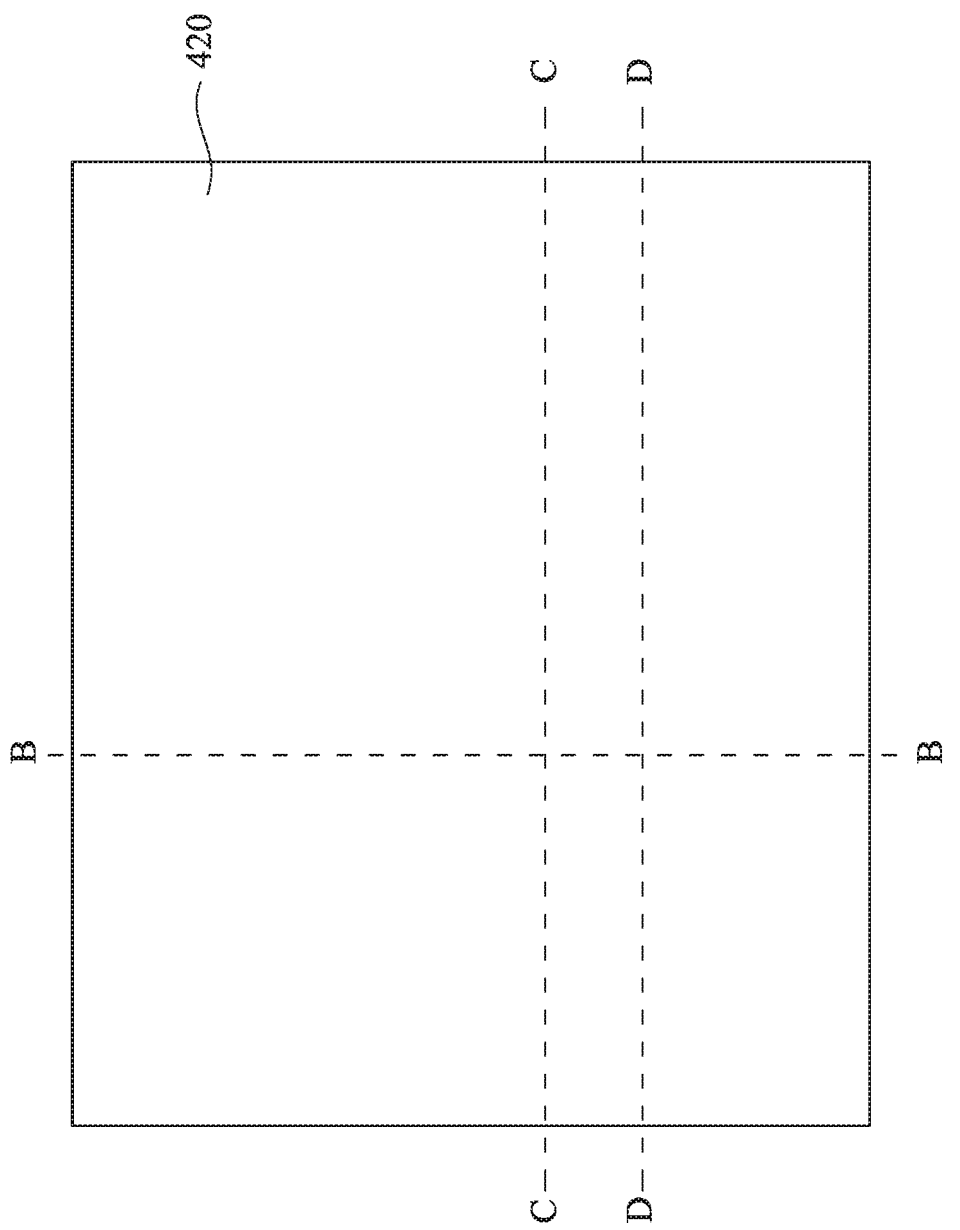
FIGS. 13A-13D illustrate a top view, a cross-sectional view along section BB, a cross-sectional view along section CC, and a cross-sectional view along section DD of the device of FIG. 13A, respectively, in a multi-stack nanowire FET device formation process in accordance with some embodiments of the instant disclosure.
Figure 13B:
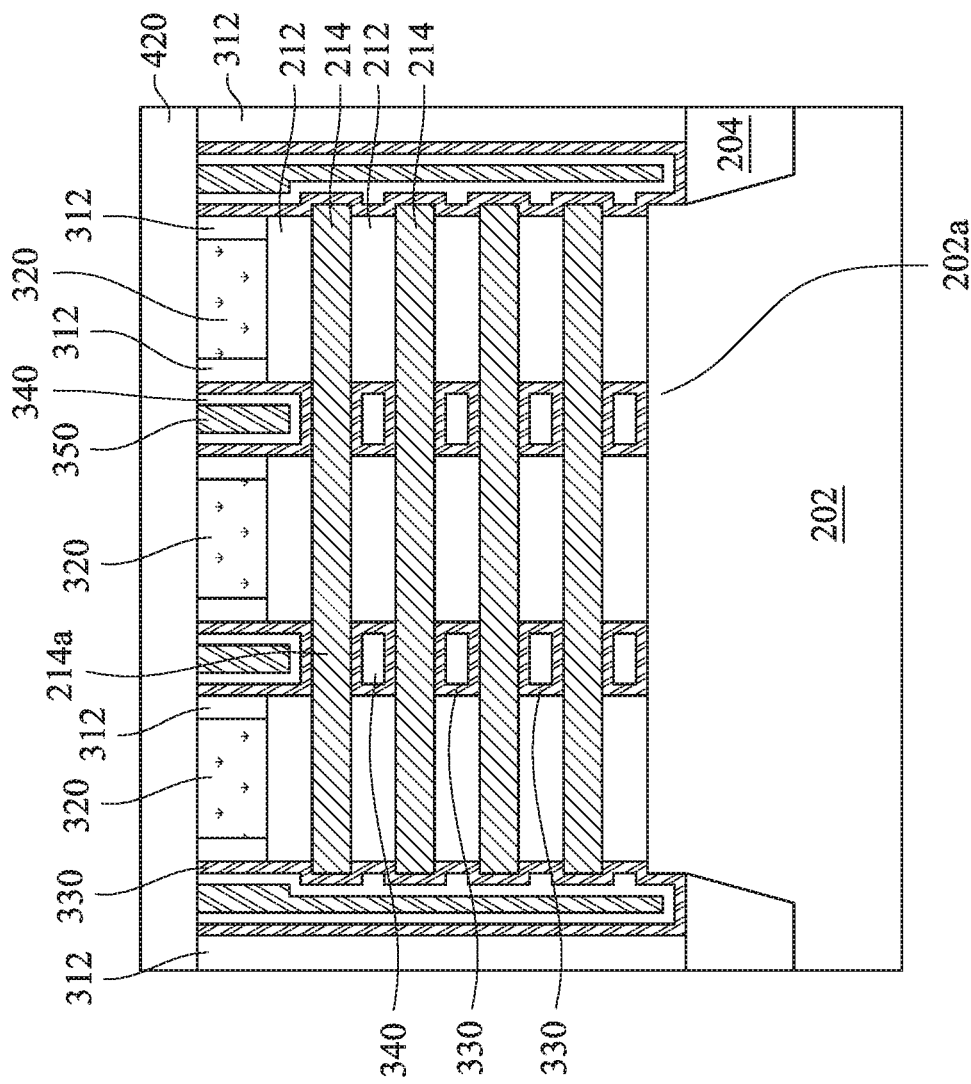
Figure 13C:
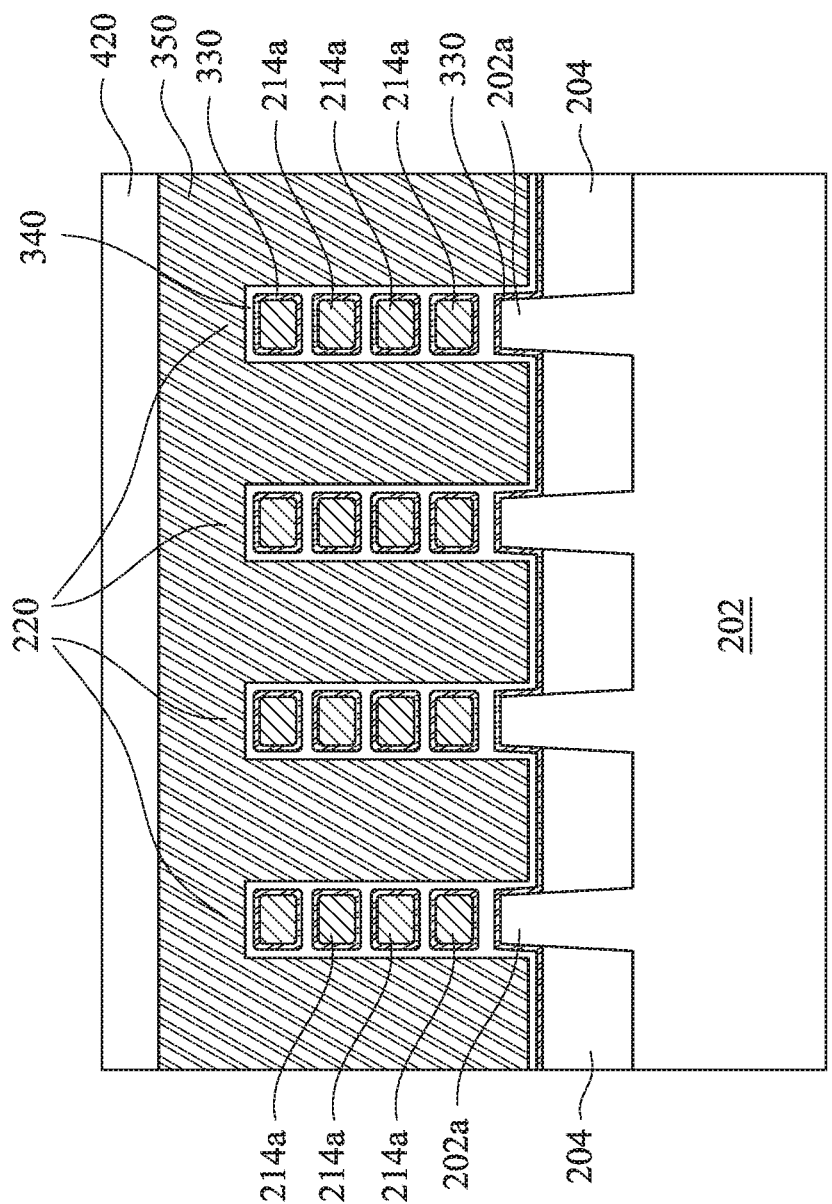
Figure 13D:
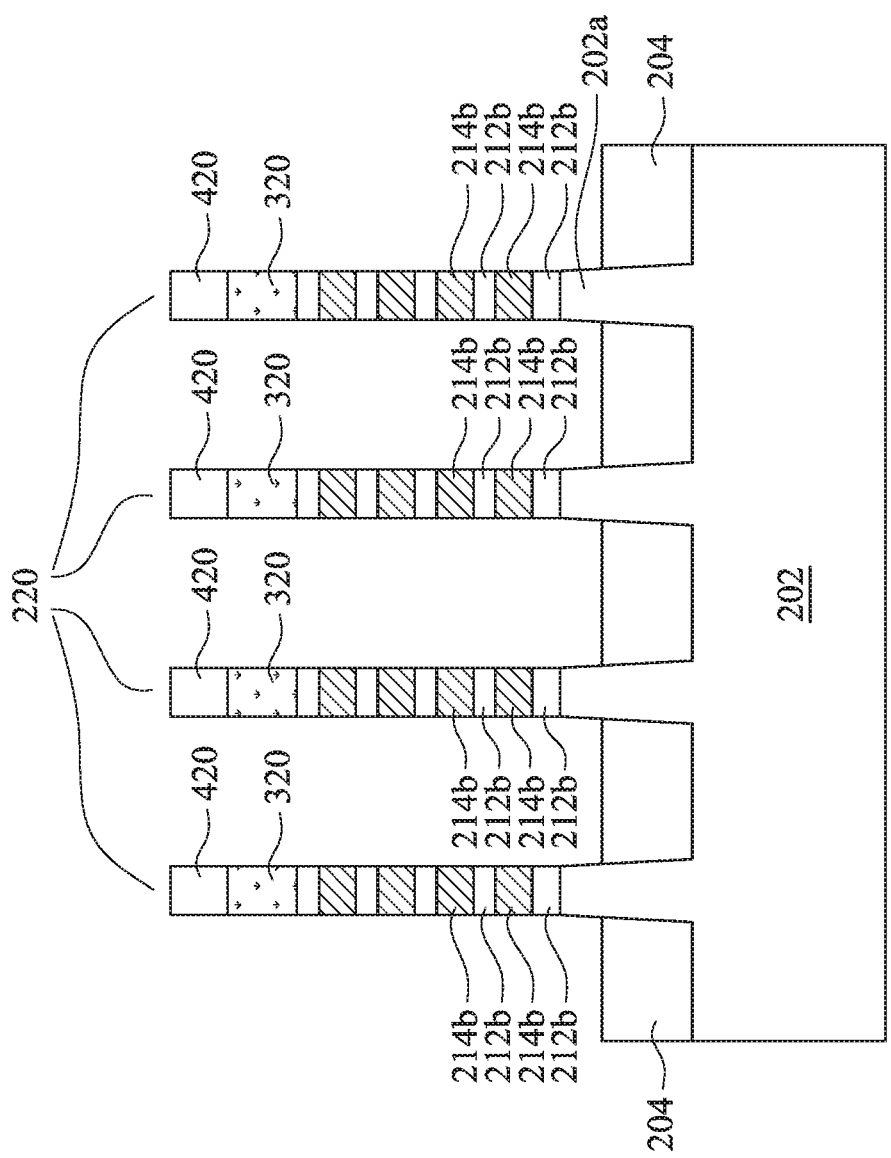

Reference is Made to FIGS. 13A-13D and operation 150 in FIG. 1. FIG. 13A is a top view of the structure 200. FIGS. 13B, 13C and 13D are cross-sectional views taken along section BB, CC and DD in FIG. 13A respectively. A second interlayer dielectric layer 420 is deposited on the semiconductor substrate 202. The second interlayer dielectric layer 420 is blanket deposition on the semiconductor substrate 202. As shown in FIG. 13B, the fins 220, spacers 312, first interlayer dielectric layer 320 and gate electrode 350 are all covered up by the second interlayer dielectric layer 420. The channel regions 220a (first portions 214a of the nanowires 214) are under the second interlayer dielectric layer 420 protection as shown in. FIG. 13C. On top of the source and drain regions 220b of the fins 220 are the first interlayer dielectric layer 320 and the second interlayer dielectric layer 420 as shown in FIG. 13D.

Figure 14A:
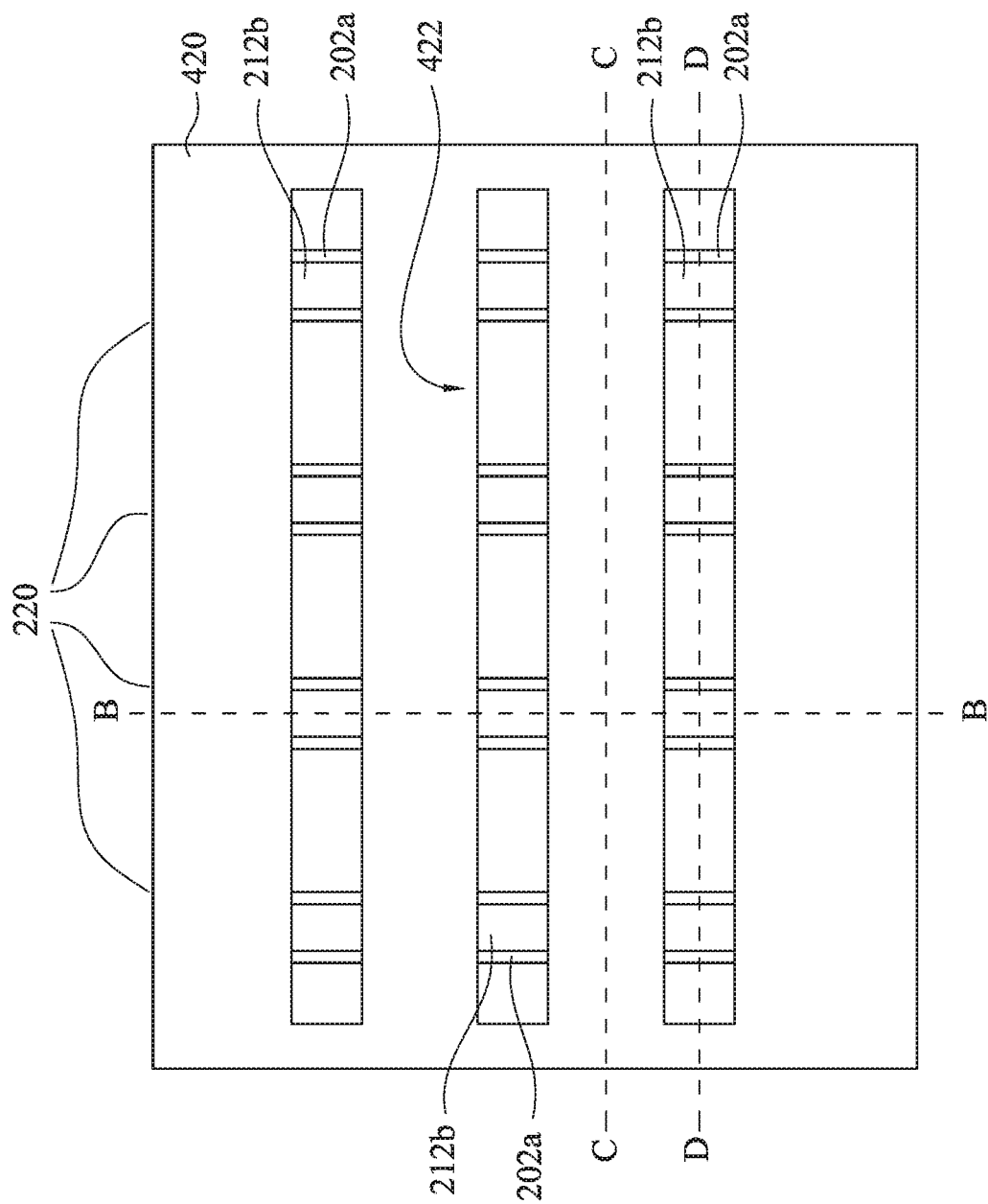
FIGS. 14A-14D illustrate a top view, a cross-sectional view along section BB, a cross-sectional view along section CC, and a cross-sectional view along section DD of the device of FIG. 14A, respectively, in a multi-stack nanowire FET device formation process in accordance with some embodiments of the instant disclosure.
Figure 14B:
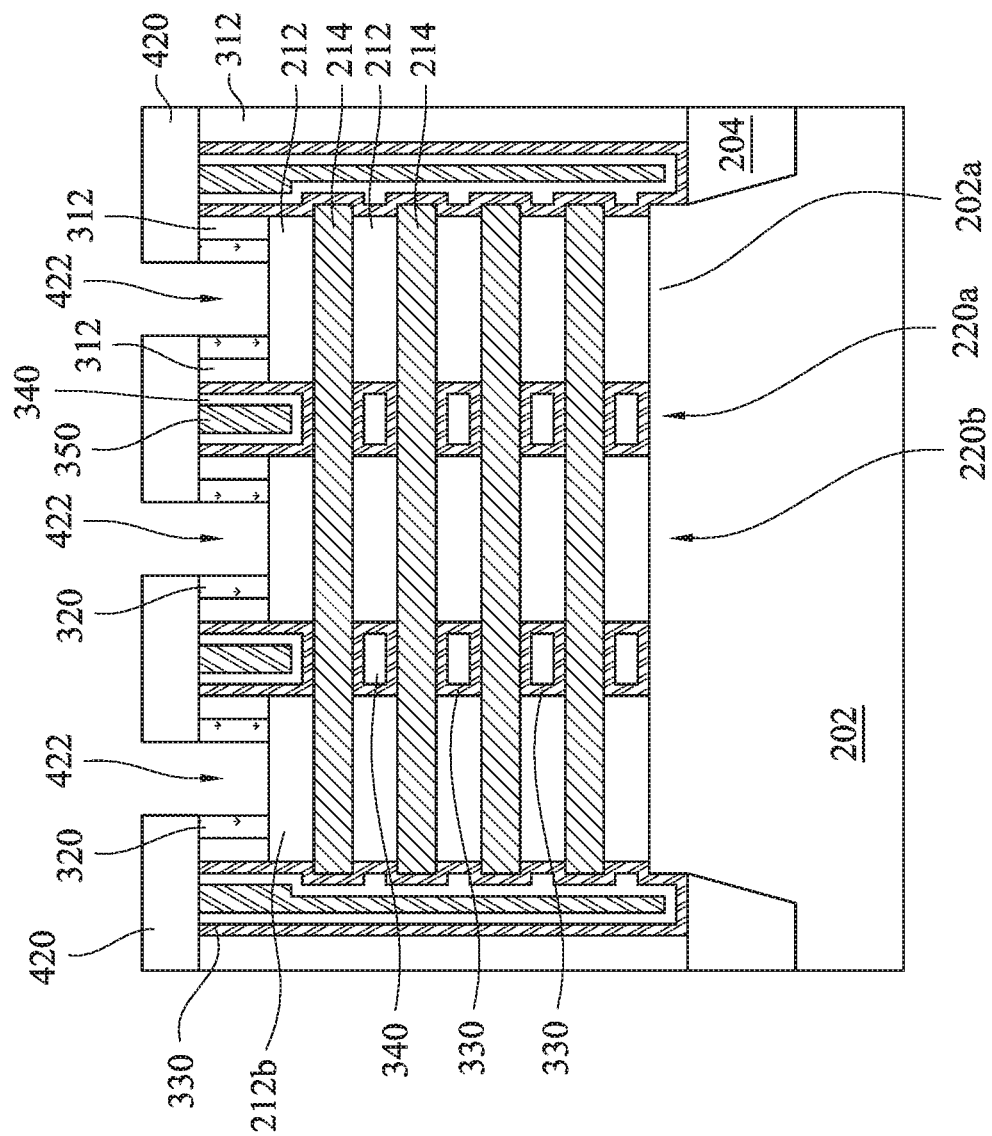
Figure 14C:
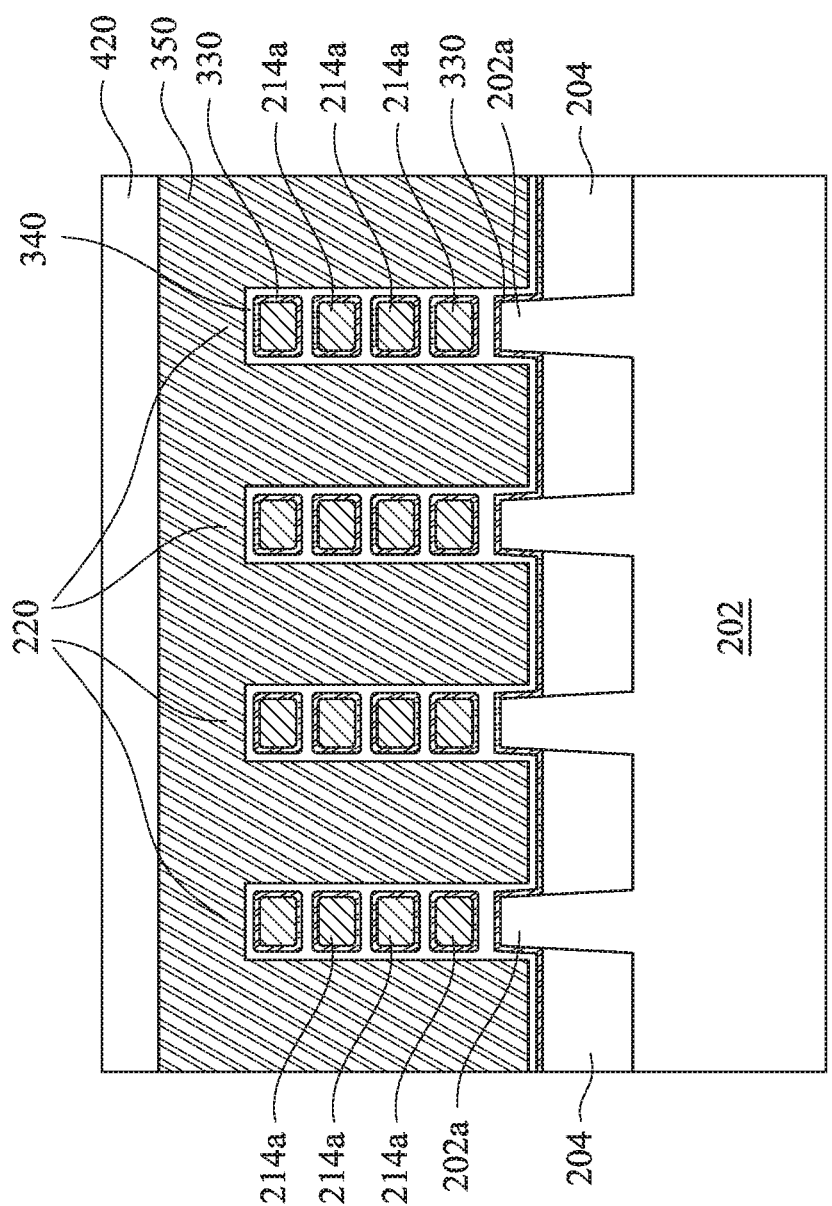
Figure 14D:
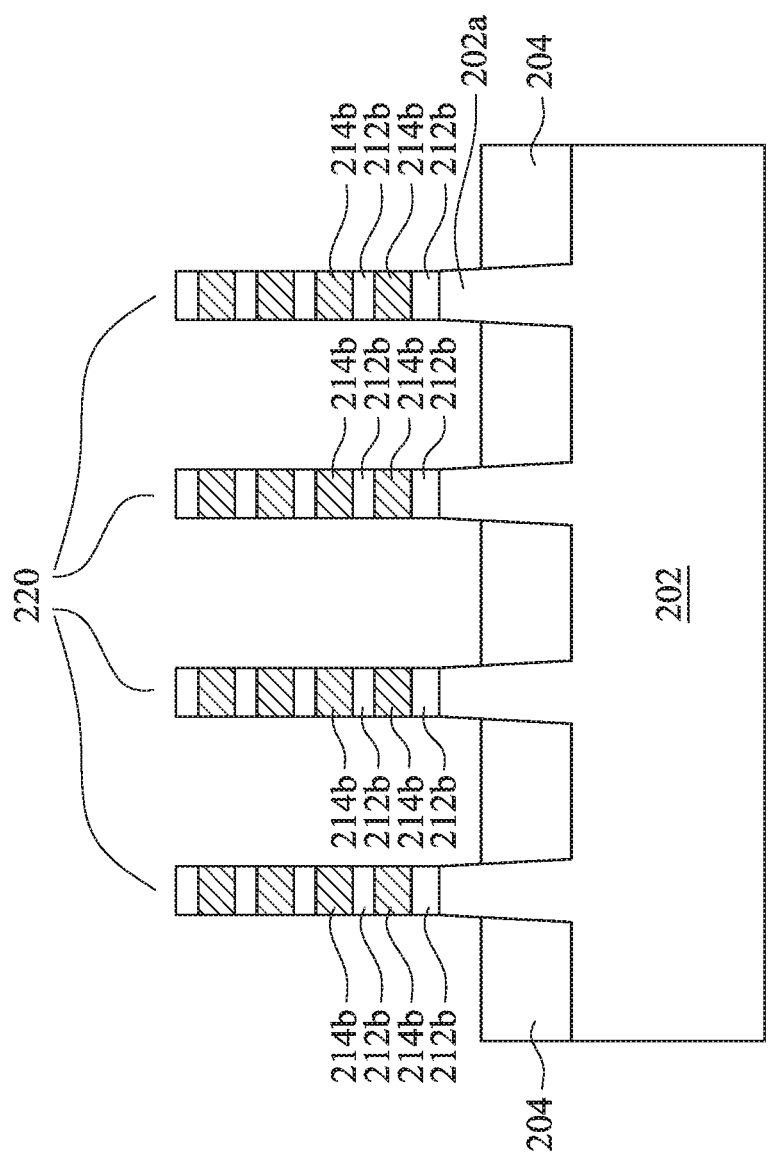

Reference is made to FIGS. 14A-14D and operation 150 in FIG. 1. FIG. 14A is a top view of the structure 200. FIGS. 14B, 14C and 14D are cross-sectional views taken along section BB, CC and DD in FIG. 14A respectively. Contact openings 422 are formed in the second interlayer dielectric layer 420. The contact openings 422 are in parallel with the gate structures (i.e., perpendicular to the fins 220) and do not overlap the gate structure and channel regions 220a of the fins 220. An etch process may be performed, portions of the second interlayer dielectric layer 420 and the first interlayer dielectric layer 320 are removed leaving spaces in strip. In some embodiments, the contact openings 422 fall between the spacers 312 and are slightly spaced apart from the spacers 312 by the first interlayer dielectric layer 320 as shown in FIG. 14B. Portions of the first interlayer dielectric layer 320 remain on the fins 220. As shown in FIGS. 14A, 14B and 14D, the contact openings 422 expose the source and drain regions 220b of the fins 220. The channel regions 220a of the fins 220 (i.e., first portions 214a of the nanowires 214) are under the protection of the second interlayer dielectric layer 420 as shown in FIG. 14C.

Figure 15A:
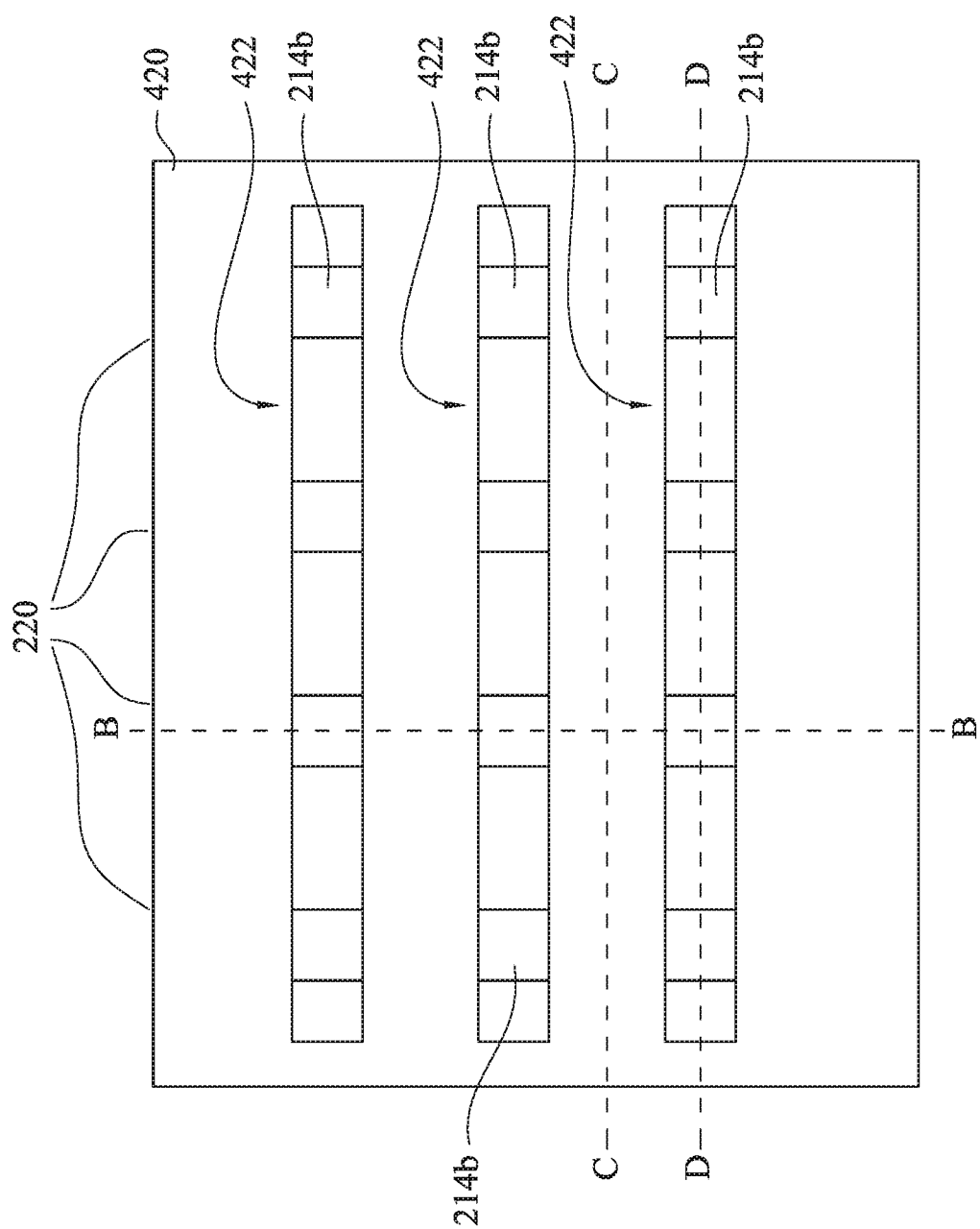
Figure 15B:
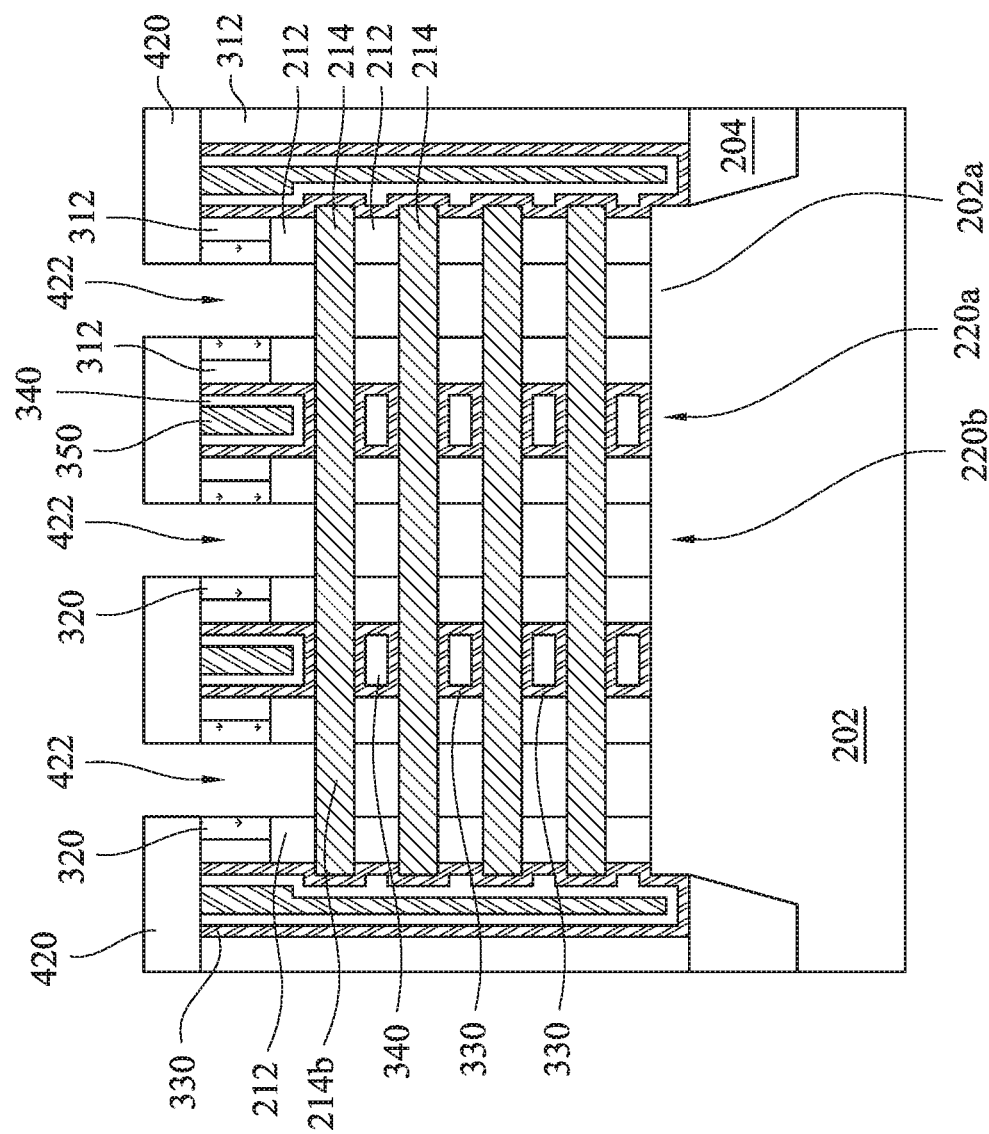
Figure 15C:
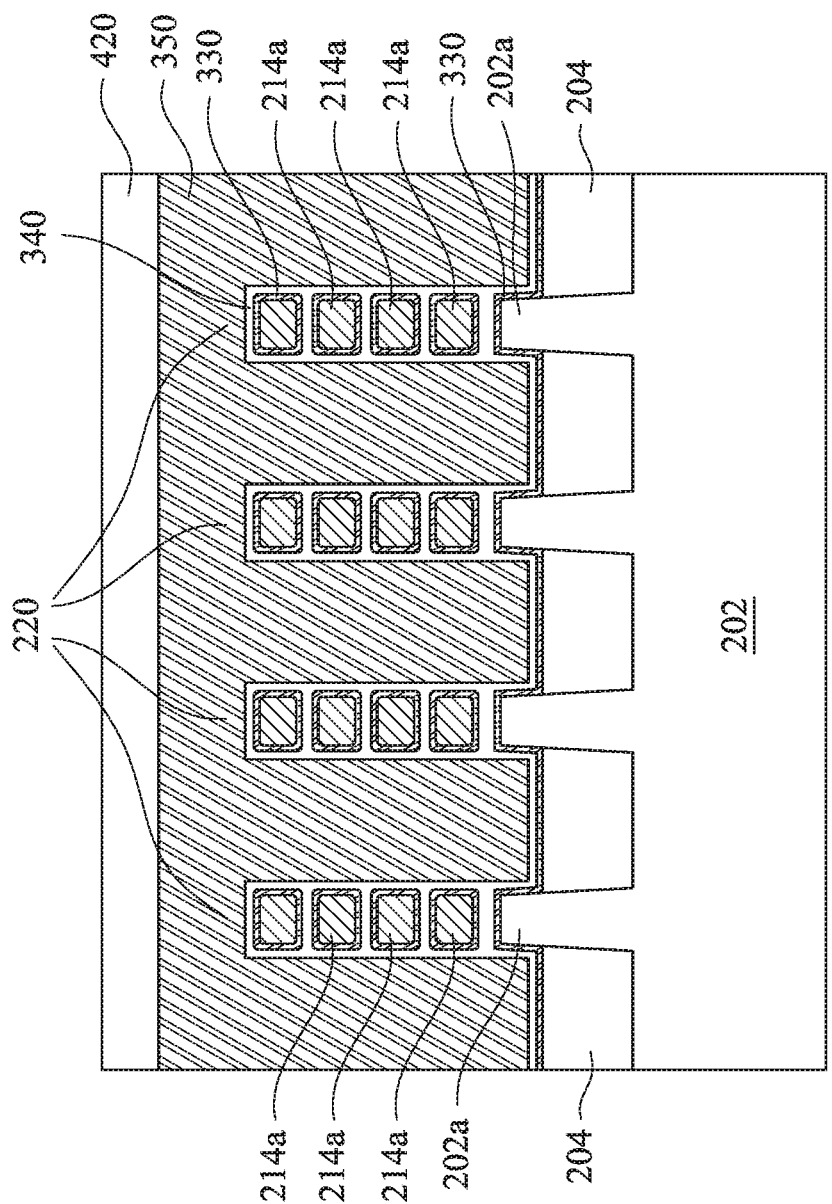

Reference is made to FIGS. 15A-15D and operation 152 in FIG. 1. FIG. 15A is a top view of the structure 200. FIGS. 15B, 15C and 15D are cross-sectional views taken along section BB, CC and DD in FIG. 15A respectively. Second portions 212b of the sacrificial layers 212 are removed. As shown in FIGS. 15A and 15B, the second portions 212b of the sacrificial layers 212 are removed. Second portions 214b of nanowires 214 are then released from the sacrificial layers 212 as shown in FIG. 15D. Spaces are left between the second portions 214b of nanowires 214 similar to the nanowire release process in FIG. 10.

The difference between the two nanowire release processes arises from the regions. In the first nanowire release, as shown in FIGS. 10A-10C, the first portions 212a of the sacrificial layers 212 are removed. The first portions 212a of the sacrificial layers 212 correspond to the channel regions 220a of the fins 220. The high-k gate dielectric layer 330, work function metal layer 340 and gate electrode 350 are formed on the first portions 214a of the nanowires 214. The second portions 214b of the nanowires 214 are stilt sandwiched between the sacrificial layers 212. In the second nanowire release, the second portions 212b of the sacrificial layers 212 are removed. The second portions 212b of the sacrificial layers 212 correspond to the second portions 214b of the nanowires 214 (i.e., source and drain regions 220b). The nanowire release process is performed twice, and it is performed in both the channel region and the source and drain region in two separate stages. The deposition of the first interlayer dielectric layer 320 masks the source and drain regions 220b, while the deposition of the second interlayer dielectric layer 420 masks the channel regions 220a. After the removal of the second portions 212b of the sacrificial layer 212, the second portions 214b of the nanowires 214 are spaced apart from each other as shown in FIG. 15D.

Figure 16A:
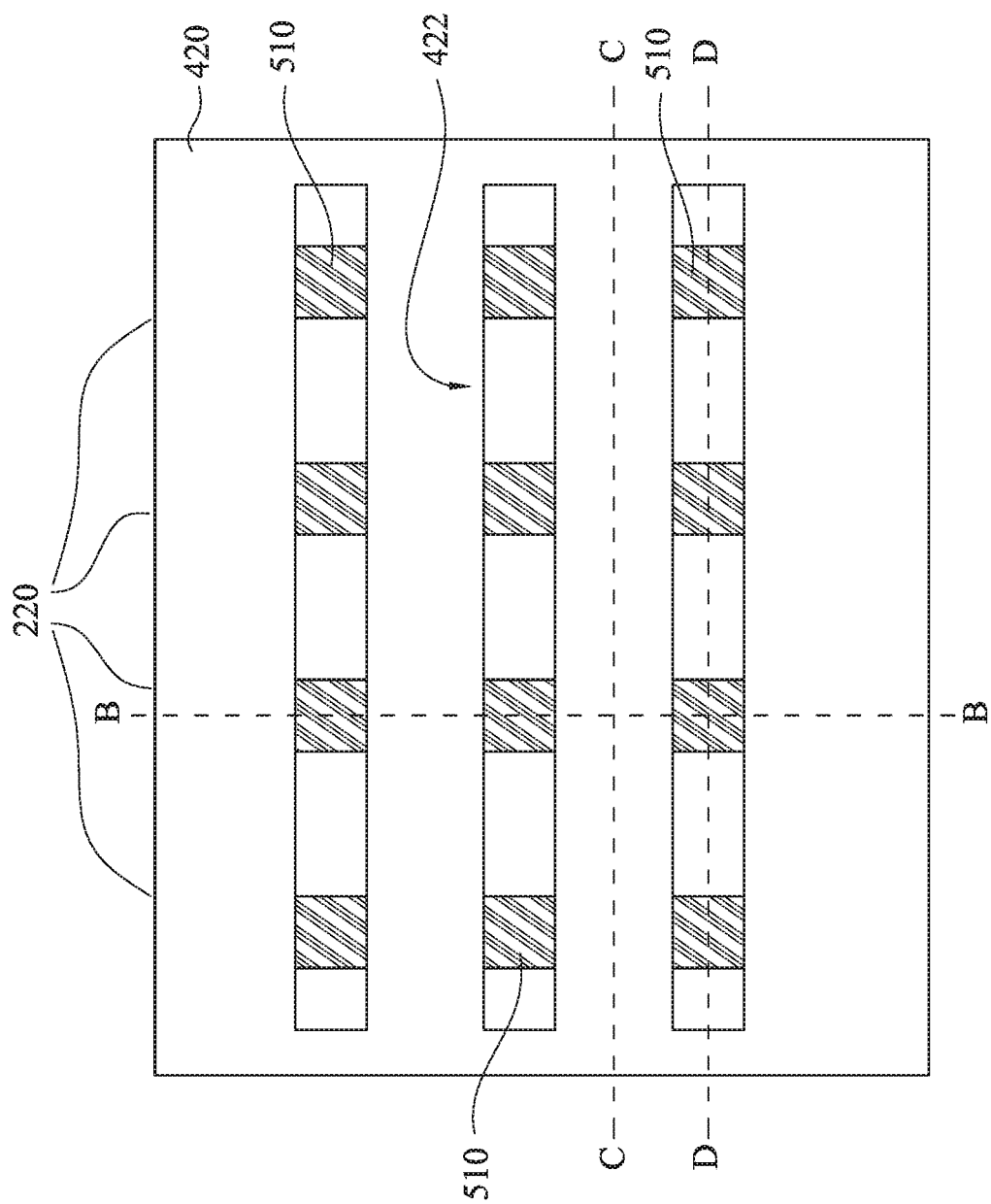
FIGS. 16A-16D illustrate a top view, a cross-sectional view along section BB, a cross-sectional view along section CC, and a cross-sectional view along section DD of the device of FIG. 16A, respectively, in a multi-stack nanowire FET device formation process in accordance with some embodiments of the instant disclosure.
Figure 16B:
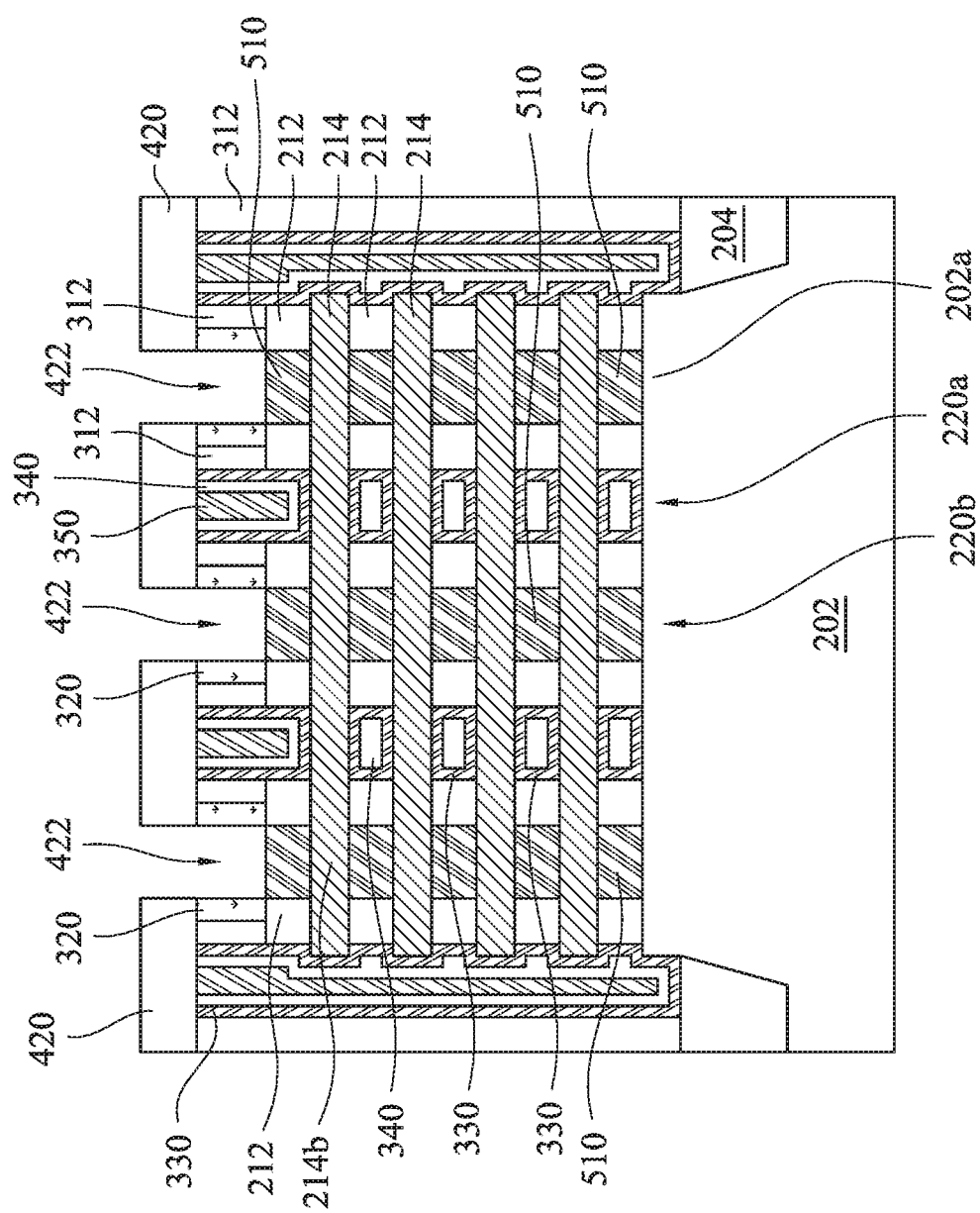
Figure 16C:
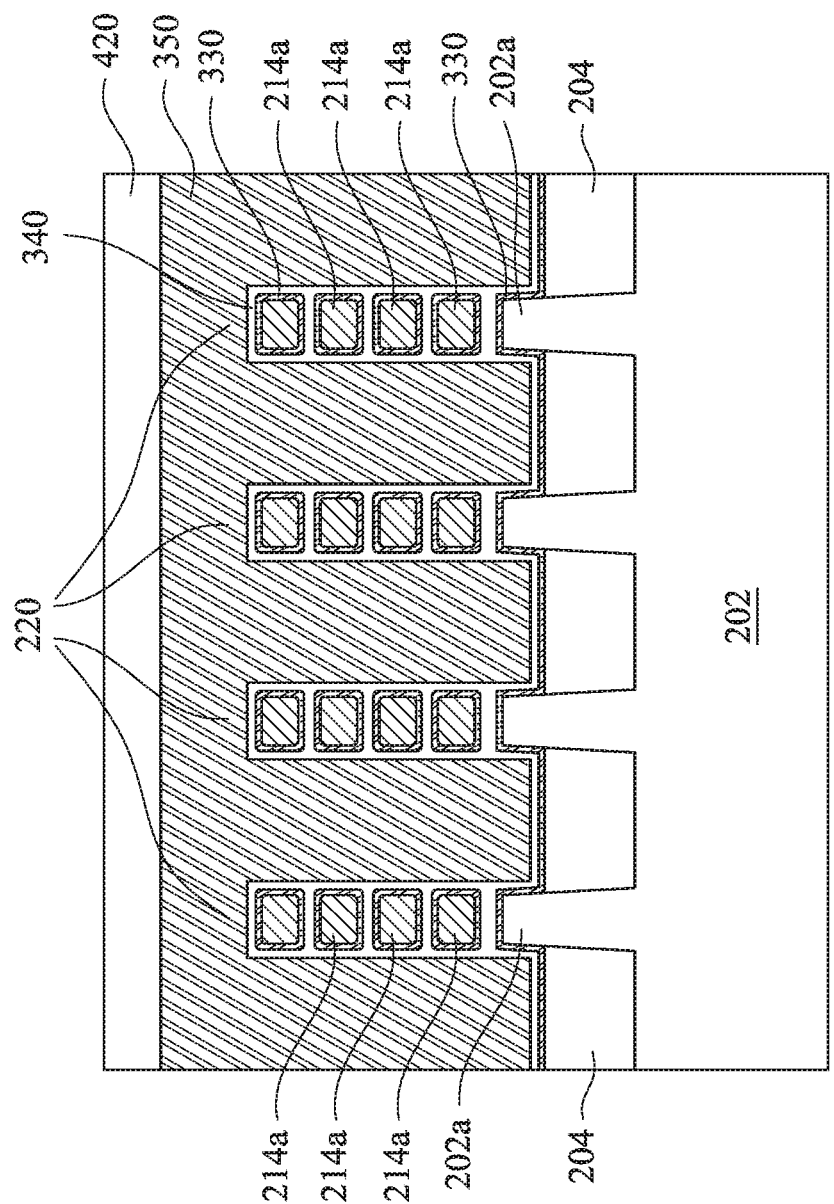
Figure 16D:
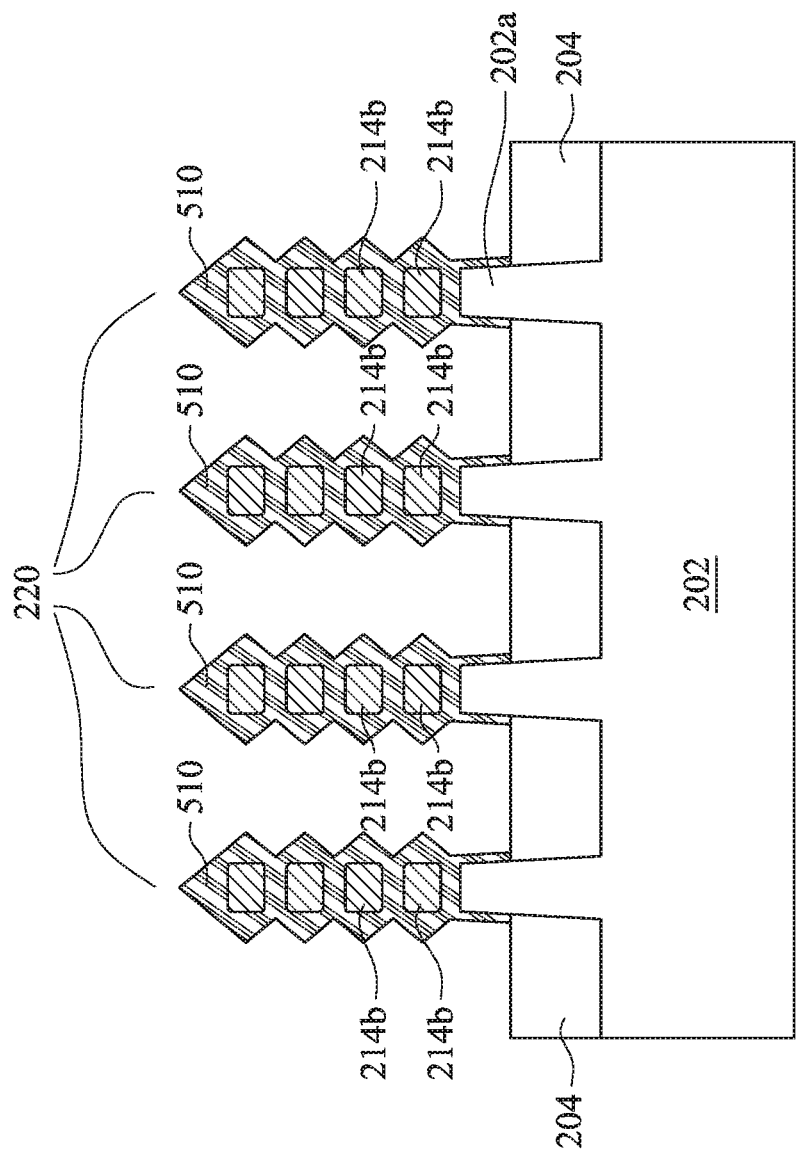

Reference is made to FIGS. 16A-16D and operation 154 in FIG. 1. FIG. 16A is a top view of the structure 200. FIGS. 16B, 16C and 16D are cross-sectional views taken along section BB, CC and DD in FIG. 16A respectively. An epitaxial layer 510 is formed on the second portions 214b of the nanowires 214. The epitaxial layer 510 includes germanium. Spaces are left between the second portions 214b of the nanowires 214, and the epitaxial layer 510 wraps around each of the second portions 214b of the nanowires 214. That is, the epitaxial layer 510 interposes in between two abreast nanowires 214 at the source and drain regions 220b.

Figure 18:
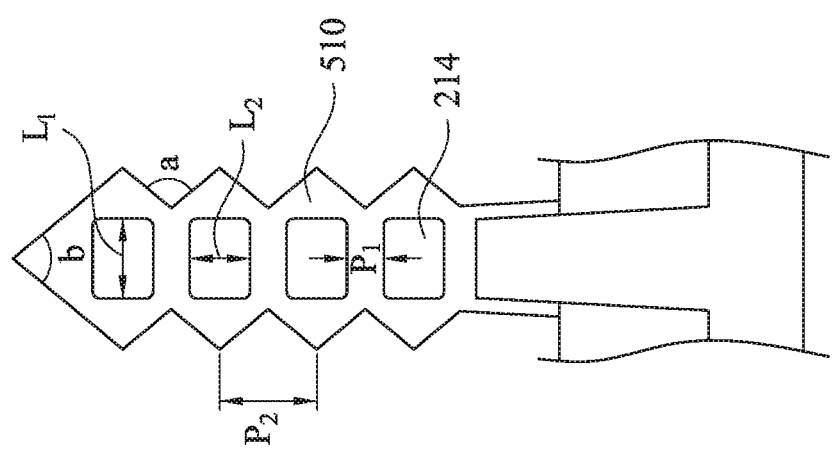
FIG. 18 illustrates an enlarged view of a portion in FIG. 16D.

Reference is made to FIG. 18, illustrating an enlarged view of area E in FIG. 16D. In some embodiments, the nanowire 214 has a height $L_1$ measured of approximately between 0.5 and 15.0 nm and a width $L_2$ measured of approximately between 0.5 and 15.0 nm. This dimension allows the nanowire 214 has a cross-sectional view of for example, square or rectangle. In some embodiments, the height $L_1$ is 7 nm and the width $L_2$ is 7 nm. In some embodiments, the height $L_1$ is 7 nm and the width $L_2$ is 12 nm, and the instant disclosure is not limited thereto. As previously discussed, the thickness of the sacrificial layer 212 determines the pitch $P_1$ between the nanowires 214 because the nanowires 214 are released from the layers of fins 220. The thickness of the sacrificial layer 212 ranges between about 0.5 and 20.0 nm. In some embodiments, if the sacrificial layers 212 have a thickness of 5 nm, the pitch $P_1$ between the nanowires 214 will be 5 nm. In some embodiments, if the sacrificial layers 212 have a thickness of 10 nm, the pitch $P_1$ between the nanowires 214 will be 10 nm. A pitch $P_2$ is measured from one peak to the immediately neighbouring peak of the epitaxial layer 510. The pitch $P_2$ is the sum of the height $L_1$ and the pitch $P_1$ and ranges between about 0.5 and 20.0 nm.

Individual nanowire 214 provides a base for the epitaxial layer 510 to grow. The epitaxial layer 510 grows according to favourable crystalline development. A zig-zag contour of the epitaxial layer 510 is then created as shown in FIG. 16D. More specifically, due to faster growth rate along the <100> and <110> plane of the nanowire 214 and slower growth rate along the <111> plane, the diamond shape of the epitaxial layer 510 is repeated in a smaller scale. The <111> facet of the epitaxial layer 510 is reproduced in each of the nanowires 214, therefore the zig-zap contour. The epitaxial layer 510 can be adapted to both NMOS and PMOS channel region.

Still refer to FIG. 18. The epitaxial layer 510 has a saw-like outline around the second portions 214b of the nanowires 214. This contour falls into a predetermined configuration. As shown in FIG. 18, angle a, which is measured between any two peaks of the epitaxial layer 510, is given by the Equation 1 of crystallography as the following:

$$\alpha = 2 \times \tan^{-1}(\sqrt{2}) = 109°$$  Equation 1

The angle a is equal to 109°, and the angle b as shown in FIG. 18 is calculated by 180° minus angle a (b=180°−α). The angle b, which is measured by the tip of the epitaxial layer 510, is therefore equal to 71°. The epitaxial layer 510 satisfies the angle requirement where the valley has the angle a (109°) and the tip has the angle b (71°).

Desirable ohmic contact can be made on <111> facets when the epitaxial layer 510 includes group IV and group III/V material. Group TV material includes but not limited to Ge, Si, and SiGe. Group III/V material includes InAs, GaAs, GaSb, and InSb. In some embodiments, Ge is used as the nanowire material. A precursor in the epi process may be GeH$_4$ or Ge$_2$H$_6$. The flow rate ranges between 50 and 800 sccm. A reaction temperature is controlled between about 390 and 500° C., and the pressure is approximately between 10 and 100 torr. In some embodiments, Si is used as the nanowire material. A precursor in the epi process may be SiH$_4$, Si$_2$H$_6$, or dicholorosilane (DCS). The flow rate ranges between 20 and 800 sccm. A reaction temperature is controlled between about 400 and 700° C., and the pressure is approximately between 20 and 200 torr. In some embodiments, SiGe is used as the nanowire material. A precursor in the epi process may be a combination of SiH$_4$/GeH$_4$ and Si$_2$H$_5$/Ge$_2$H$_6$. The flow rate ranges between 20 and 800 sccm. A reaction temperature is controlled between about 390 and 550° C., and the pressure is approximately between 20 and 200 torr. Group IV materials and their reaction conditions are listed in Table 1.

TABLE 1

| | Precursor | Flow rates (sccm) | Temperature (° C.) | P (Torr) |
|---|---|---|---|---|
| Ge | GeH$_4$ | 50-800 | 450-500 | 10-100 |
| | Ge$_2$H$_6$ | 50-800 | 390-500 | 10-100 |
| Si | SiH$_4$ | 20-500 | 450-550 | 20-200 |
| | Si$_2$H$_6$ | 20-500 | 400-550 | 20-200 |
| | DCS | 20-500 | 500-700 | 20-200 |
| SiGe | SiH$_4$/GeH$_4$ | 20-800 | 450-550 | 20-200 |
| | Si$_2$H$_6$/Ge$_2$H$_6$ | 20-800 | 450-550 | 20-200 |

In some embodiments, InAs is used as the nanowire material. A precursor in the epi process may be trimethylindium (TMIn) or trimethylaluminium (TMA). The flow rate ranges between 50 and 500 sccm. A ratio between In:As ranges between about 10 and 100. A reaction temperature is controlled between about 400 and 540° C., and the pressure is approximately between 10 and 400 torr. In some embodiments, GaAs is used as the nanowire material. A precursor in the epi process may be trimethylgallium (TMGa) or tertiarybutylarsine (TBA). The flow rate ranges between 5 and 500 sccm. A ratio between As:Ga ranges between about 10 and 100. A reaction temperature is controlled between about 400 and 600° C., and the pressure is approximately between 20 and 200 torr. In some embodiments, GaSb is used as the nanowire material. A precursor in the epi process may be TMGa or trimethylstibine (TMSb). The flow rate ranges between 1 and 150 sccm. A ratio between Sb:Ga ranges between about 1 and 20. A reaction temperature is controlled between about 450 and 550° C., and the pressure is approximately between 10 and 400 torr. In some embodiments, InSb is used as the nanowire material. A precursor in the epi process may be TMIn or TMSb. The flow rate ranges between 1 and 500 sccm. A ratio between Sb:In ranges between about 1 and 20. A reaction temperature is controlled between about 400 and 550° C., and the pressure is approximately between 10 and 400 torr. Group III/V materials and their reaction conditions are listed in Table 2.

TABLE 2

| | Precursor | Flow rates (sccm) | V:III ratio | Temperature (° C.) | P (Torr) |
|---|---|---|---|---|---|
| InAs | TMIn | 50-500 | 10-100 | 400-540 | 10-400 |
| | TBA | 50-500 | 10-100 | 400-540 | 10-400 |
| GaAs | TMGa | 5-50 | 10-100 | 400-600 | 10-400 |
| | TEGa | 20-150 | 10-100 | 400-600 | 10-400 |
| | TBA | 50-500 | 10-100 | 400-600 | 10-400 |
| GaSb | TMGa | 5-50 | 1-20 | 450-550 | 10-400 |
| | TEGa | 20-150 | 1-20 | 450-550 | 10-400 |
| | TMSb | 1-20 | 1-20 | 450-550 | 10-400 |
| InSb | TMIn | 50-500 | 1-20 | 400-550 | 10-400 |
| | TMSb | 1-20 | 1-20 | 400-550 | 10-400 |

In some embodiments, precursor TBA may be replaced by AsH$_3$. In some embodiments, precursor TMSb may be replaced by TESb.

Figure 17A:
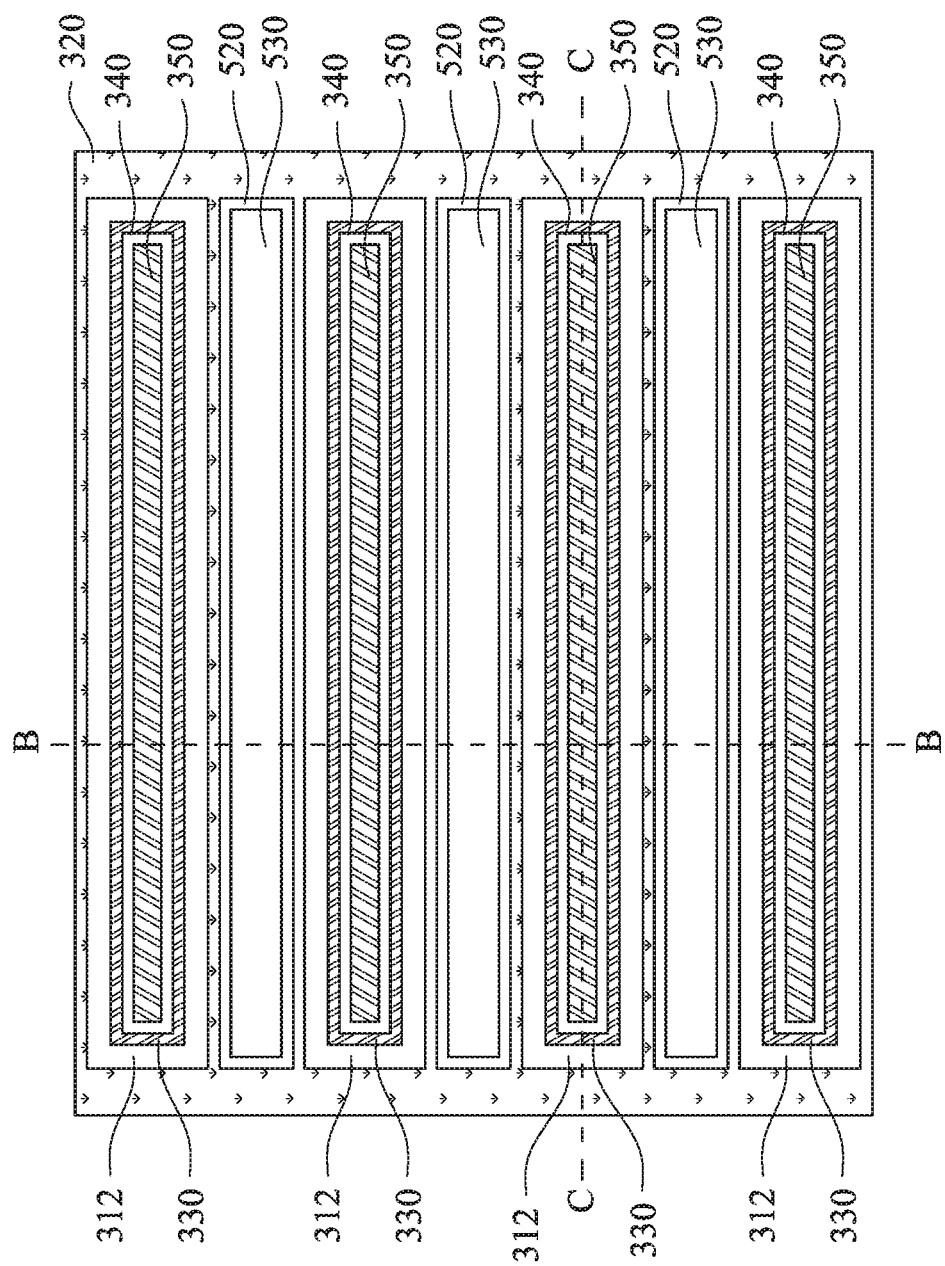
FIGS. 17A-17D illustrate a top view, a cross-sectional view along section BB, a cross-sectional view along section CC, and a cross-sectional view along section DD of the device of FIG. 17A, respectively, in a multi-stack nanowire PET device formation process in accordance with some embodiments of the instant disclosure.
Figure 17B:
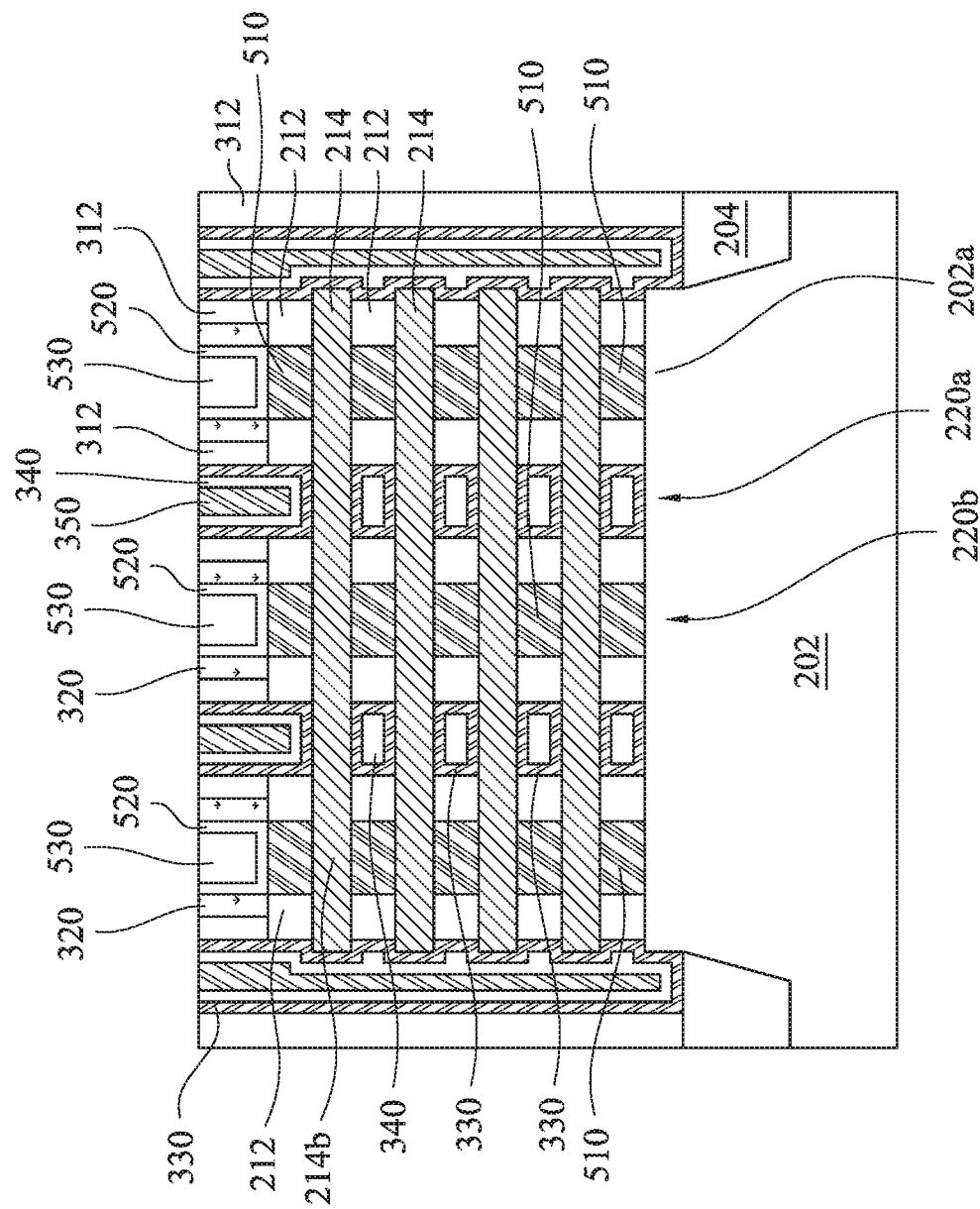
Figure 17C:
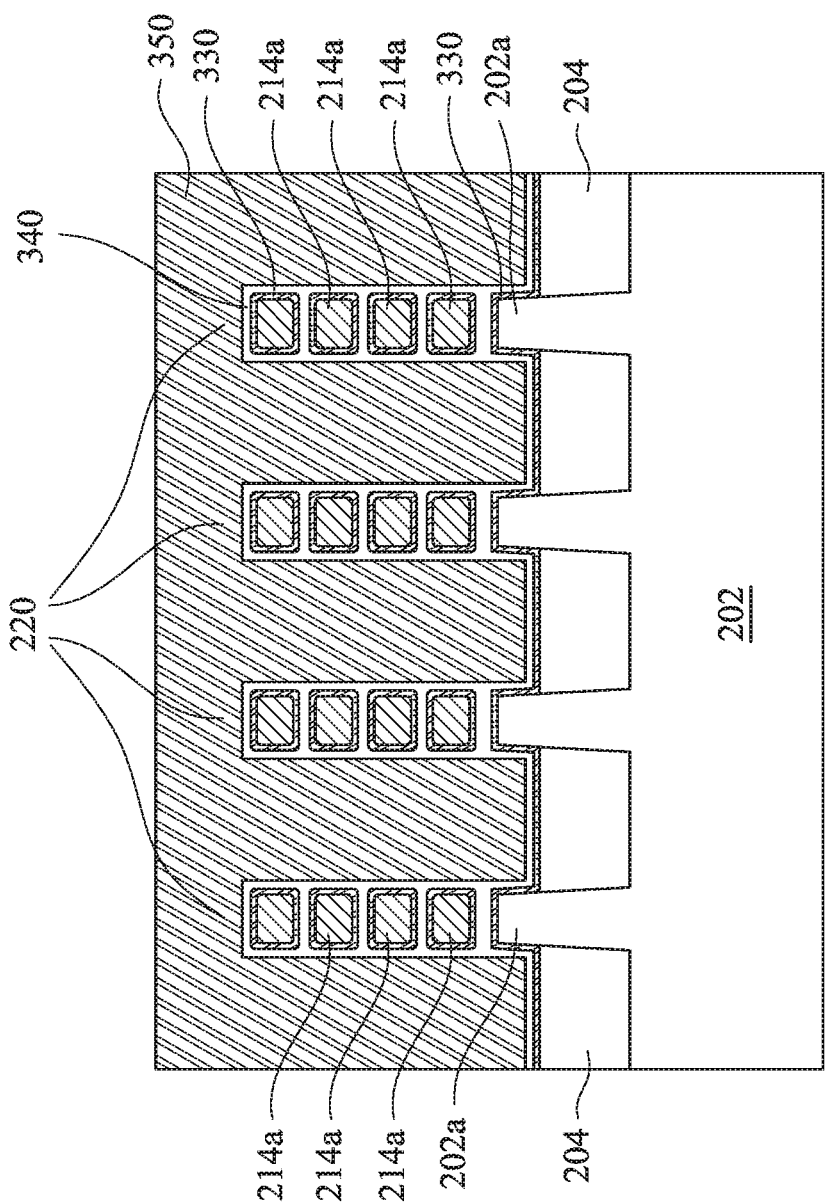
Figure 17D:
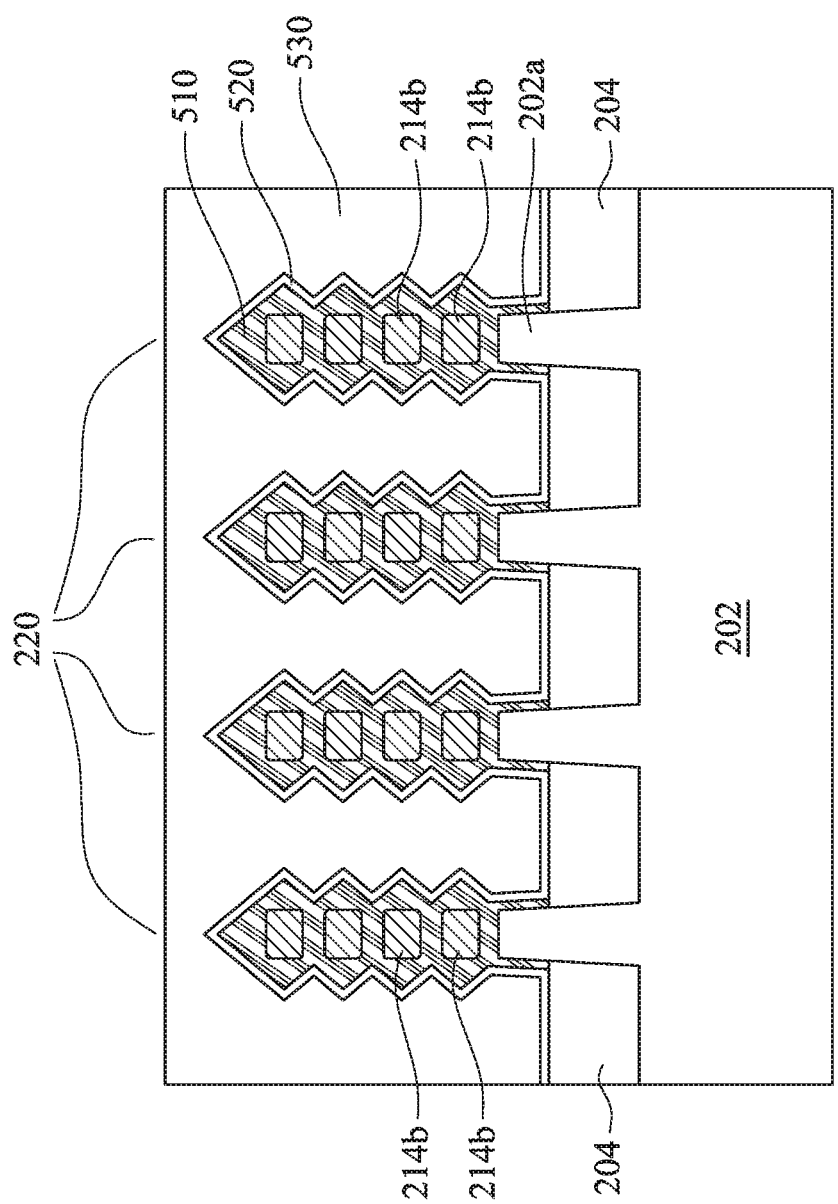

Reference is made to FIGS. 17A-17D. FIG. 17A is a top view of the structure 200. FIGS. 17B, 17C and 17D are cross-sectional views taken along section BB, CC and DD in FIG. 17A respectively. The work function metal layer 520 and the metal layer 530 are formed. After the formation of the epitaxial layer 510, the second interlayer dielectric layer 420 is removed by for example, CMP. A work function metal layer 520 is deposited and formed along the contour created by the epitaxial layer 510. Unlike the work function metal layer 340 shown in FIG. 15C, the work function metal layer 520 does not wrap around each of the nanowires 214 because the epitaxial layer 510 provides a merged coat around the second portions 214b of the nanowires 214 as shown in FIG. 17D. The work function metal layer 520 follows the zig-zag topology of the epitaxial layer 510. In this case, the contact area between the epitaxial layer 510 and the work function metal layer 520 is maximized. More specifically, the <111> plane of the epitaxial layer 510 is reproduced more than once. When the work function metal layer 520 is conformally formed on the epitaxial layer 510, each of the exposed <111> planes of the epitaxial layer 510 makes contact with the work function metal layer 520. Subsequently, the metal layer 530 is formed on the work function metal layer 520.

The structure 200 includes the semiconductor substrate 202 and the isolation structure 204. The nanowires 214 are stacked on the semiconductor substrate 202 and spaced apart by the sacrificial layers 212. The first portions 214a of the nanowires 214 are the channel regions including high-k gate dielectric layer 330, work function metal layer 340 and gate electrode 350. The second portions 214b of the nanowires 214 are the source and drain regions. The second portions 214b are lightly doped, and the epitaxial layer 510 is formed around the second portions 214b. The epitaxial layer 510 wraps around each of the nanowires 214 and replaces the spaces left by the sacrificial layers 212 after nanowire release. The epitaxial layer 510 includes material that favours <111> plane crystalline growth. Each of the second portions 214b of the nanowire 214 is surrounded by the diamond shaped epitaxial layer 510. The epitaxial layer 510 creates a collective zig-zag contour around the nanowires 214. The zig-zag epitaxial layer 510 increases contact area when the work function metal layer 520 and the metal layer 530 are deposited on the epitaxial layer 510. All the facets, which are <111> planes, of the epitaxial layer 510 make contact with the work function metal layer 520. The relationships between the facets of the epitaxial layer 510 satisfy the Equation 1 where the valley opens at 109° and the tip has the angle b of 71°.

The nanowires undergo twice releasing process, the first one being channel region release and the second one being source and drain region release. The source and drain region nanowire release process allows individual nanowire to be spaced apart from the neighbouring nanowire. The epitaxial layer formed around each of the nanowires and creates a collective zig-zag contour. The exposed <111> planes of the epitaxial layer ensure large contact area and desirable electrical property such as ohmic contact in the subsequent metallization process.

In some embodiments of the present disclosure, a method includes forming a plurality of first semiconductor layers and second semiconductor layers in an alternate manner over a substrate; etching the first semiconductor layers and second semiconductor layers to form a fin structure, wherein the fin structure Comprises a plurality of first nanowires and second nanowires alternately arranged, the first nanowires have respective remaining portions of the first semiconductor layers, and the second nanowires have respective remaining portions of second semiconductor layers; forming a dummy gate over the fin structure; forming a plurality of gate spacers on opposite sidewalls of the dummy gate, respectively; replacing the dummy gate with a metal gate; removing first portions of the second nanowires exposed by the metal gate and metal gate and the gate spacers suspended; and forming an epitaxy layer wrapping around the first portions of the first nanowires, wherein opposite sidewalls of the epitaxy layer have zig-zag contour.

In some embodiments of the present disclosure, a method includes forming a plurality of first semiconductor layers and second semiconductor layers in an alternate manner over a substrate; etching the first semiconductor layers and second semiconductor layers to form a fin structure, wherein the fin structure comprises a plurality of first nanowires and second nanowires alternately arranged, the first nanowires have respective remaining portions of the first semiconductor layers, and the second nanowires have respective remaining portions of second semiconductor layers; removing first portions of the second nanowires, while leaving first portions of first nanowires suspended; forming a metal gate wrapping around each of the first portions of first nanowires; removing second portions of the second nanowires, while leaving second portions of the first nanowires suspended; and forming an epitaxy layer wrapping around the second portions of the first nanowires, wherein a sidewall of the epitaxy layer has a first facet, a second facet continuously extending from the first facet, and a third facet continuously extending from the second, and the first, second and third facets have <111> plane.

In some embodiments of the present disclosure, a method includes forming a plurality of first semiconductor layers and second semiconductor layers in an alternate manner over a substrate; etching the first semiconductor layers and second semiconductor layers to form a fin structure, wherein the fin structure comprises a plurality of first nanowires and second nanowires alternately arranged, the first nanowires have respective remaining portions of the first semiconductor layers, and the second nanowires have respective remaining portions of second semiconductor layers; forming a dummy gate over the fin structure; forming a plurality of gate spacers on opposite sidewalls of the dummy gate; depositing an interlayer dielectric layer adjacent to the gate spacers; replacing the dummy gate with a work function metal and a gate electrode; etching the interlayer dielectric layer to form an opening after replacing the dummy gate; etching the second nanowires through the opening; and forming an epitaxial layer wrapping around the first nanowires after etching the second nanowires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a plurality of first semiconductor layers and second semiconductor layers in an alternate manner over a substrate;
   etching the first semiconductor layers and second semiconductor layers to form a fin structure, wherein the fin structure comprises a plurality of first nanowires and second nanowires alternately arranged, the first nanowires have respective remaining portions of the first semiconductor layers, and the second nanowires have respective remaining portions of second semiconductor layers;
   forming a dummy gate over the fin structure;
   forming a plurality of gate spacers on opposite sidewalls of the dummy gate, respectively;
   replacing the dummy gate with a metal gate;
   removing first portions of the second nanowires exposed by the metal gate and the gate spacers; and
   forming an epitaxy layer wrapping around the first portions of the first nanowires, wherein opposite sidewalls of the epitaxy layer have zig-zag contour.

2. The method of claim 1, wherein forming the epitaxy layer is performed such that the epitaxy layer is separated from the gate spacers by a distance viewed in a cross-section along a longitudinal axis of the first nanowires.

3. The method of claim 1, wherein the zig-zag contour has <111> plane.

4. The method of claim 1, wherein replacing the dummy gate comprises:

etching the dummy gate to expose second portions of the first nanowires and second portions of second nanowires;

etching the second portions of the second nanowires, while leaving the second portions of the first nanowires suspended; and forming a work function metal and a gate electrode wrapping around each of the second portions of the first nanowires.

5. The method of claim 1, further comprising:

forming an interlayer dielectric layer over the dummy gate prior to forming the epitaxy layer; and performing a chemical mechanical polishing to the interlayer dielectric layer until a top surface of the dummy gate exposed.

6. The method of claim 5, further comprising forming an opening in the interlayer dielectric layer to expose the first portions of the second nanowires prior to removing first portions of the second nanowires.

7. The method of claim 6, wherein removing the first portions of the second nanowires is performed such that the second nanowires remain under the interlayer dielectric layer.

8. A method, comprising:

forming a plurality of first semiconductor layers and second semiconductor layers in an alternate manner over a substrate;

etching the first semiconductor layers and second semiconductor layers to form a fin structure, wherein the fin structure comprises a plurality of first nanowires and second nanowires alternately arranged, the first nanowires have respective remaining portions of the first semiconductor layers, and the second nanowires have respective remaining portions of second semiconductor layers;

removing first portions of the second nanowires, while leaving first portions of first nanowires suspended;

forming a metal gate wrapping around each of the first portions of first nanowires;

removing second portions of the second nanowires, while leaving second portions of the first nanowires suspended; and forming an epitaxy layer wrapping around the second portions of the first nanowires, wherein a sidewall of the epitaxy layer has a first facet, a second facet continuously extending from the first facet, and a third facet continuously extending from the second, and the first, second and third facets have <111> plane.

9. The method of claim 8, wherein the first, second and third facets form a zig-zag contour.

10. The method of claim 8, wherein forming the metal gate comprises:

forming a dummy gate crossing the first and second nanowires;

forming a interlayer dielectric layer adjacent to the dummy gate prior to removing the second portions of the second nanowires; and replacing the dummy gate with a work function metal layer and a gate electrode.

11. The method of claim 10, further comprising:

forming a mask layer over the interlayer dielectric layer and the metal gate; and patterning the mask layer and the interlayer dielectric layer to form an opening exposing the first and second nanowires prior to removing the second portions of the second nanowires.

12. The method of claim 11, further comprising removing the mask layer after forming the epitaxy layer.

13. The method of claim 10, wherein removing the second portions of the second nanowires is performed such that a remaining portion of the second nanowires extends along a bottom surface of the interlayer dielectric layer.

14. The method of claim 10, further comprises forming a gate spacer on a sidewall of the dummy gate, wherein forming the epitaxy layer is performed such that the epitaxy layer is separated from an outer sidewall of the gate spacer by the interlayer dielectric.

15. The method of claim 8, wherein forming the metal gate is performed prior to forming the epitaxy layer.

16. A method, comprising:

forming a plurality of first semiconductor layers and second semiconductor layers in an alternate manner over a substrate;

etching the first semiconductor layers and second semiconductor layers to form a fin structure, wherein the fin structure comprises a plurality of first nanowires and second nanowires alternately arranged, the first nanowires have respective remaining portions of the first semiconductor layers, and the second nanowires have respective remaining portions of second semiconductor layers;

forming a dummy gate over the fin structure;

forming a plurality of gate spacers on opposite sidewalls of the dummy gate;

depositing an interlayer dielectric layer adjacent to the gate spacers;

replacing the dummy gate with a work function metal and a gate electrode;

etching the interlayer dielectric layer to form an opening after replacing the dummy gate;

etching the second nanowires through the opening; and forming an epitaxial layer wrapping around the first nanowires after etching the second nanowires.

17. The method of claim 16, further comprising:

forming a dielectric layer over the interlayer dielectric layer; and patterning the dielectric layer, wherein etching the interlayer dielectric layer is performed by using the patterned dielectric layer as an etch mask.

18. The method of claim 17, further comprising removing the patterned dielectric layer after etching the second nanowires through the opening.

19. The method of claim 16, wherein etching the second nanowires is performed such that the second nanowires remain under the interlayer dielectric layer and the gate spacers.

20. The method of claim 16, wherein sidewalls of the epitaxy layer have zig-zag contour.

* * * * *